US012641845B2

(12) United States Patent
Tsai et al.

(10) Patent No.: US 12,641,845 B2
(45) Date of Patent: May 26, 2026

(54) SEMICONDUCTOR CONTACT STRUCTURE INCLUDING VIA STRUCTURE WITH METAL BULK LAYER NESTED WITHIN BARRIER LINER AND METHOD FOR FORMING THE SAME

(71) Applicant: Taiwan Semiconductor Manufacturing Company, Ltd., Hsinchu (TW)

(72) Inventors: Kuo-Chiang Tsai, Hsinchu City (TW); Jeng-Ya Yeh, New Taipei City (TW); Jhon-Jhy Liaw, Zhudong Township, Hsinchu County (TW); Mu-Chi Chiang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 493 days.

(21) Appl. No.: 18/299,294

(22) Filed: Apr. 12, 2023

(65) Prior Publication Data

US 2024/0347594 A1 Oct. 17, 2024

(51) Int. Cl.
| | |
|---|---|
| *H10D 62/10* | (2025.01) |
| *H10D 30/67* | (2025.01) |
| *H10D 84/01* | (2026.01) |
| *H10D 84/03* | (2025.01) |
| *H10D 84/83* | (2025.01) |

(52) U.S. Cl.
CPC ....... *H10D 62/121* (2025.01); *H10D 30/6735* (2025.01); *H10D 84/0128* (2025.01); *H10D 84/038* (2025.01); *H10D 84/834* (2025.01)

(58) Field of Classification Search
CPC ............ H10D 30/6735; H10D 84/834; H10D 62/121; H10D 84/0128; H10D 30/6757; H10D 84/038; H10D 84/013
See application file for complete search history.

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 2021/0082922 | A1 * | 3/2021 | Huang ................ H01L 23/5283 |

* cited by examiner

*Primary Examiner* — Changhyun Yi
(74) *Attorney, Agent, or Firm* — Cooper Legal Group, LLC

(57) ABSTRACT

A method for forming a semiconductor structure is provided. The method for forming the semiconductor structure includes a first contact plug and a second contact plug through a first dielectric layer, forming a second dielectric layer over the first contact plug, the second contact plug and the first dielectric layer, etching the second dielectric layer to form a first opening exposing the first contact plug, the second contact plug and the first dielectric layer, forming a bottom via portion in the first opening, forming a third dielectric layer over the bottom via portion and the second dielectric layer, etching the third dielectric layer to form a second opening exposing the bottom via portion, and forming a top via portion in the second opening. The top via portion and the bottom via portion form a first via.

20 Claims, 32 Drawing Sheets

SEMICONDUCTOR CONTACT STRUCTURE INCLUDING VIA STRUCTURE WITH METAL BULK LAYER NESTED WITHIN BARRIER LINER AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1, 2B-1, 2C-1, 2D-1, 2E-1, 2F-1, 2G-1, 2H-1, 2I-1 and 2J-1 are cross-sectional views of the semiconductor structure taken along line X1-X1 of FIGS. 2A, 2B, 2C, 2D, 2F, 2G, 2I and 2J, in accordance with some embodiments of the disclosure.

FIGS. 2A-2, 2B-2, 2C-2, 2D-2, 2E-2, 2F-2, 2G-2, 2H-2, 2I-2 and 2J-2 are cross-sectional views of the semiconductor structure taken along line X2-X2 of FIGS. 2A, 2B, 2C, 2D, 2F, 2G, 2I and 2J, in accordance with some embodiments of the disclosure.

FIG. 2J-3 is a cross-sectional view of the semiconductor structure taken along line Y-Y of FIG. 2J, in accordance with some embodiments of the disclosure.

FIG. 3 is a cross-sectional view of a via of FIG. 2J-1, in accordance with some embodiments of the disclosure.

FIGS. 5A-1, 5B-1 and 5C-1 are cross-sectional views of the semiconductor structure taken along line X1-X1 of FIGS. 5A, 5B and 5C, in accordance with some embodiments of the disclosure.

FIGS. 5A-2, 5B-2 and 5C-2 are cross-sectional views of the semiconductor structure taken along line X2-X2 of FIGS. 5A, 5B and 5C, in accordance with some embodiments of the disclosure.

FIG. 6-1 is a cross-sectional view of the semiconductor structure taken along line X1-X1 of FIG. 6, in accordance with some embodiments of the disclosure.

FIG. 6-2 is a cross-sectional view of the semiconductor structure taken along line X2-X2 of FIG. 6, in accordance with some embodiments of the disclosure.

DETAILED DESCRIPTION

Figure 1:
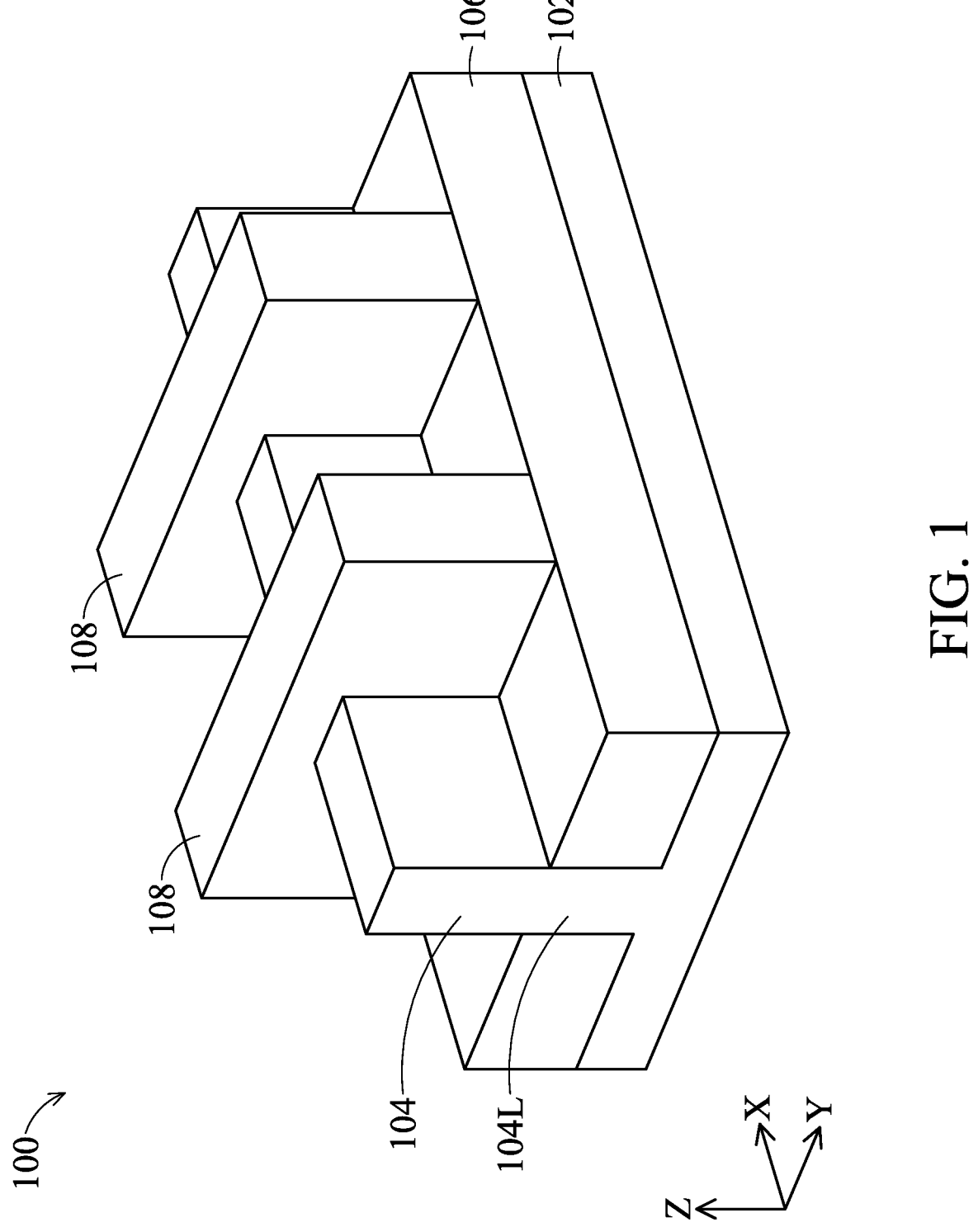
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Embodiments of a semiconductor structure and a method for forming the same are provided. The semiconductor structure includes a via landing on and extending over two contact plugs and an interlayer dielectric layer. The via includes a bottom via portion and a top via portion, in accordance with some embodiments. The top via portion is formed using a bottom-up deposition process, and may grow from the metal surface provided by the bottom via portion in the deposition process, which may facilitate the formation of void-free via. Therefore, the resistance of the via may reduce, and thus the performance of the semiconductor device may improve.

FIG. 1 is a perspective view of a semiconductor structure 100, in accordance with some embodiments of the disclosure. The semiconductor structure 100 includes a substrate 102 and fin structure 104 over the substrate 102, as shown in FIG. 1, in accordance with some embodiments. The fin structure 104 is the active region of the semiconductor structure 100, in accordance with some embodiments. For a better understanding of the semiconductor structure 100, the X-Y-Z coordinate reference is provided in the figures of the present disclosure. The X-axis and the Y-axis are generally orientated along the lateral (or horizontal) directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

Fin structures described below may be patterned by any suitable method. For example, the fins may be patterned using one or more lithography processes, including double-patterning or multi-patterning processes. Generally, double-patterning or multi-patterning processes combine lithography and self-aligned processes, allowing patterns to be created that have, for example, pitches smaller than what is otherwise obtainable using a single, direct lithography process. For example, in one embodiment, a sacrificial layer is formed over a substrate and patterned using a lithography process. Spacers are formed alongside the patterned sacrificial layer using a self-aligned process. The sacrificial layer is then removed, and the remaining spacers may then be used to pattern the fins.

The fin structure 104 extends in the X direction, in accordance with some embodiments. That is, the longitudinal axis of the fin structure 104 is parallel to the X direction, in accordance with some embodiments. The X direction may also be referred to as the channel-extending direction. The current of the resulting semiconductor devices (i.e., Fin-FETs) flows in the X direction through the channel. The fin structure 104 is defined as several channel regions and source/drain regions, where the channel regions and the source/drain regions are alternately arranged, in accordance with some embodiments. In this disclosure, a source/drain refers to a source and/or a drain. The number of channel regions and source/drain regions may be dependent on the demands on the design of the circuit and/or performance considerations of the semiconductor device.

An isolation structure 106 is formed over the substrate 102 and surrounds the lower portion 104L of the fin structure 104, in accordance with some embodiments. Gate structures 108 are formed with longitudinal axes parallel to the Y direction and extending across and/or surrounding the channel regions of the fin structure 104 and the isolation structure 106, in accordance with some embodiments. The source/drain regions of the fin structure 104 are exposed from the gate structures 108, in accordance with some embodiments. The Y direction may also be referred to as a gate-extending direction.

FIGS. 2A, 2B, 2C, 2D, 2F, 2G, 2I and 2J are plan views illustrating the formation of a semiconductor structure 100 at various intermediate stages, in accordance with some embodiments of the disclosure.

Figure 2A:
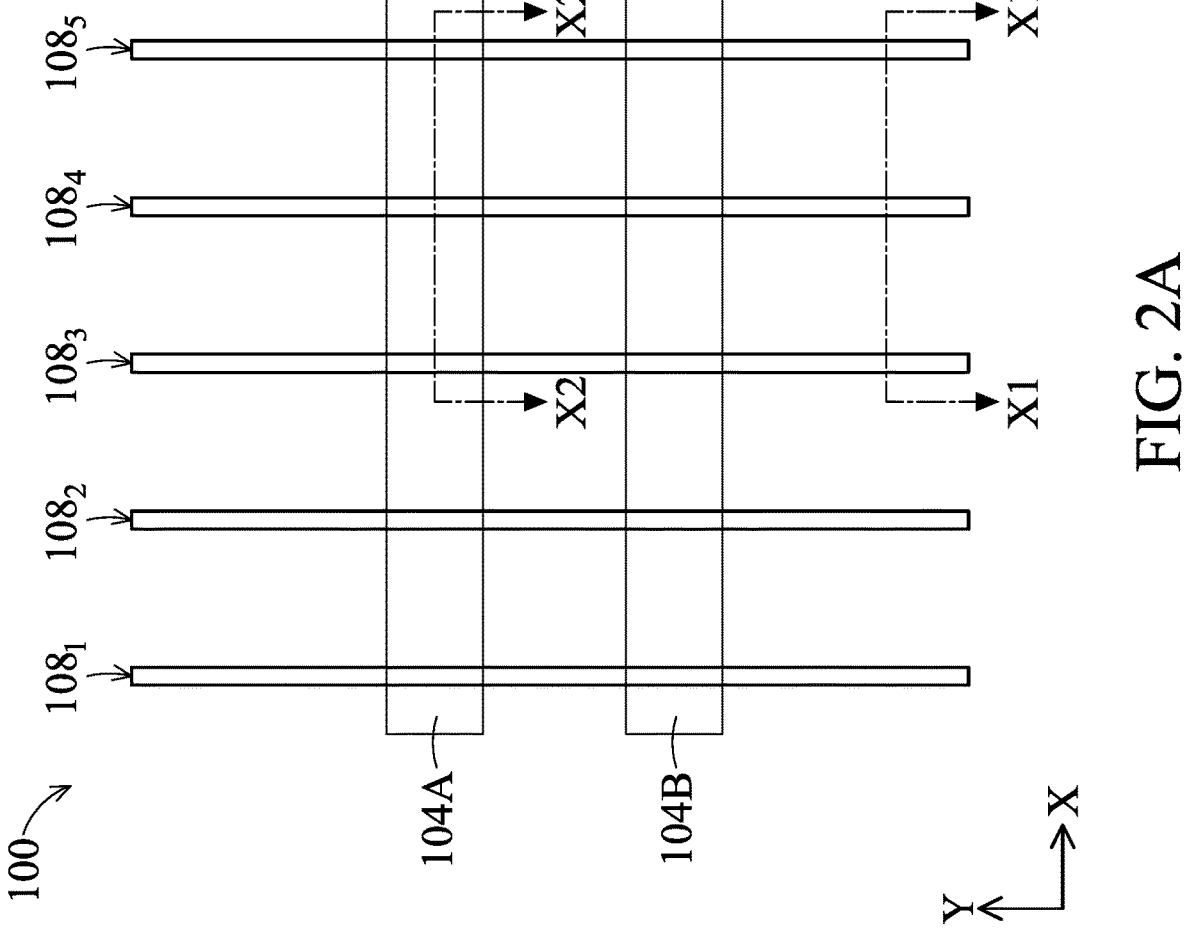
FIGS. 2A, 2B, 2C, 2D, 2F, 2G, 2I and 2J are plan views illustrating the formation of a semiconductor structure at various intermediate stages, in accordance with some embodiments of the disclosure.
Figures 2, 2A:
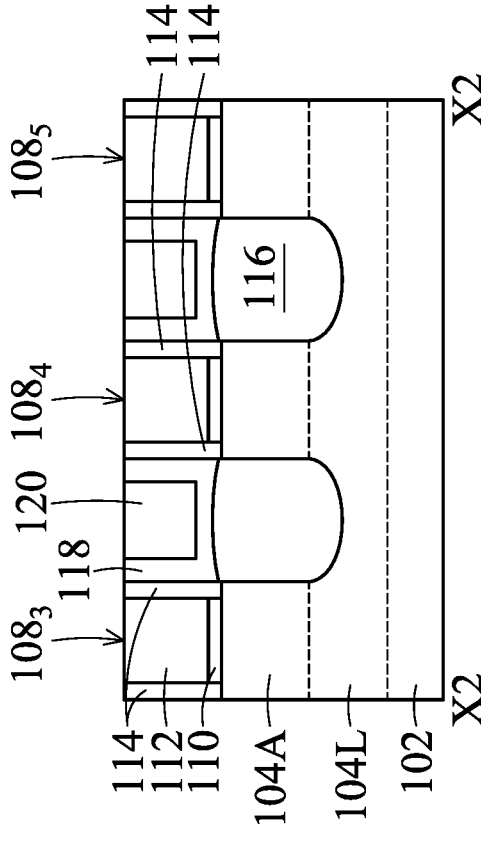
Figures 1, 2A:
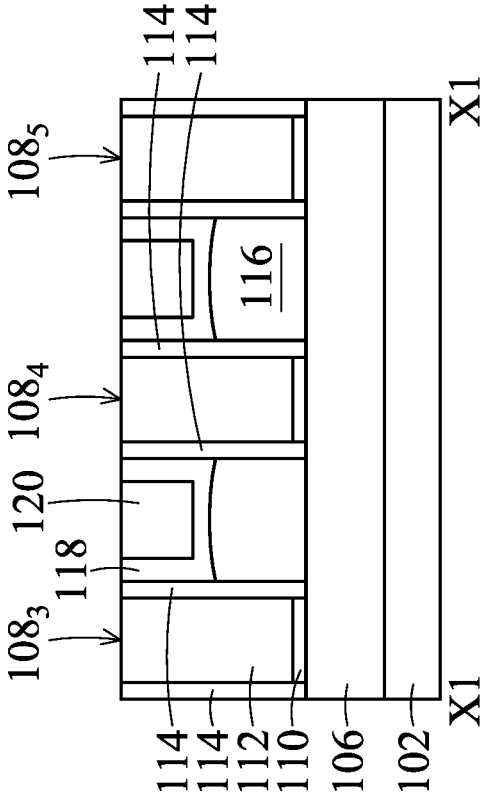

FIGS. 2A through 2A-2 illustrate a semiconductor structure 100 after the formation of active regions 104, an isolation structure 106, dummy gate structures 108, gate spacer layers 114, source/drain features 116, a contact etching stop layer (CESL) 118, and a first interlayer dielectric layer (ILD) 120, in accordance with some embodiments. FIGS. 2A-1 and 2A-2 are cross-sectional views corresponding to X1-X1 and line X2-X2 of FIG. 2A, respectively. It should be noted that the plan views in the present disclosure only illustrate some components of the semiconductor structure 100 for illustrative purposes, some other components of the semiconductor structure 100 may be shown in the cross-sectional views.

The semiconductor structure 100 includes a substrate 102, active regions 104 (including 104A and 104B) and an isolation structure 106 over the substrate 102, and dummy gate structures 108 (including $108_{1-5}$) over the active regions 104A and 104B and the isolation structure 106, as shown in FIGS. 2A through 2A-2, in accordance with some embodiments. In some embodiments, the active regions 104A and 104B extend in the X direction. The active regions 104A and 104B have longitudinal axes parallel to the X direction, in accordance with some embodiments. That is, the dimensions (lengths) of the active regions 104 in the X direction are greater than the dimensions (widths) of the active regions 104 in the Y direction. In some embodiments, the active regions 104A and 104B are the fin structure 104 as shown in FIG. 1.

The substrate 102 may be a portion of a semiconductor wafer, a semiconductor chip (or die), and the like. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

The formation of the active regions 104A and 104B includes patterning the substrate 102 thereby forming trenches, in accordance with some embodiments. The portions of the substrate 102 that protrude from between the trenches serve as the active regions 104A and 104B, in accordance with some embodiments. The patterning process may include photolithography and etching processes.

The isolation structure 106 is formed over the substrate 102 to partially fill the trenches, as shown in FIG. 2A-1, in accordance with some embodiments. The isolation structure 106 surrounds lower portions 104L of the active regions 104A and 104B, in accordance with some embodiments. The top surface and the bottom surface of the isolation structure 106 are illustrated as dash lines in FIG. 2A-2. The isolation structure 106 may be also referred to as shallow trench isolation (STI) feature. In some embodiments, the isolation structure 106 is made of dielectric material such as silicon oxide ($SiO_2$), silicon nitride (SiN), silicon oxynitride (SiON), silicon carbide (SIC), oxygen-doped silicon carbide (SiC:O), oxygen-doped silicon carbonitride (Si(O)CN), or a combination thereof.

In some embodiments, the formation of the isolation structure 106 includes depositing a dielectric material for the isolation structure 106 to overfill the trenches. In some embodiments, the dielectric material is deposited using chemical vapor deposition (CVD) (such as such as flowable CVD (FCVD), low-pressure CVD (LPCVD), plasma-enhanced CVD (PECVD), high density plasma CVD (HDP-CVD), or high aspect ratio process (HARP)), atomic layer deposition (ALD), another suitable technique, and/or a combination thereof. The dielectric material formed over the tops of the active regions 104 is planarized, for example, using CMP, an etching back process, or a combination thereof, in accordance with some embodiments. The dielectric material is further recessed using an etching process to expose the sidewalls of the active regions 104A and 104B, in accordance with some embodiments. The remainder of the dielectric material serves as an isolation structure 106, in accordance with some embodiments.

The dummy gate structures $108_{1-5}$ extend across the active regions 104A and 104B and the isolation structure 106, as shown in FIGS. 2A through 2A-2, in accordance with some embodiments. The dummy gate structures $108_{1-5}$ surround the channel regions of the active regions 104A and 104B, in accordance with some embodiments. The dummy gate structures $108_{1-5}$ are configured as sacrificial structures and will be replaced with final gate stacks, in accordance with some embodiments. In some embodiments, the dummy gate structures $108_{1-5}$ extend in the Y direction. The dummy gate structures $108_{1-5}$ have longitudinal axes parallel to the Y direction, in accordance with some embodiments. That is, the dimensions (lengths) of the dummy gate structures $108_{1-5}$ in the Y direction are greater than the dimensions (widths) of the dummy gate structures $108_{1-5}$ in the X direction.

Each of the dummy gate structures $108_{1-5}$ includes a dummy gate dielectric layer 110 and a dummy gate electrode layer 112 formed over the dummy gate dielectric layer 110, as shown in FIGS. 2A-1 and 2A-2, in accordance with some embodiments. In some embodiments, the dummy gate dielectric layer 110 is made of one or more dielectric materials, such as silicon oxide (SiO), silicon nitride (SiN), silicon oxynitride (SiON), $HfO_2$, HfZrO, HfSiO, HfTiO, HfAlO, and/or a combination thereof. In some embodiments, the dielectric material is formed using ALD, CVD, thermal oxidation, physical vapor deposition (PVD), another suitable technique, and/or a combination thereof. In some embodiments, the dummy gate electrode layer 112 is made of semiconductor material such as polysilicon, poly-silicon germanium. In some embodiments, the dummy gate electrode layer 112 is made of a conductive material such as metallic nitrides, metallic silicides, metals, and/or a combination thereof. In some embodiments, the material for the dummy gate electrode layer 112 is formed using CVD, another suitable technique, and/or a combination thereof.

In some embodiments, the formation of the dummy gate structures $108_{1-5}$ includes globally and conformally depositing a dielectric material for the dummy gate dielectric layer 110 over the semiconductor structure 100, depositing a material for the dummy gate electrode layer 112 over the dielectric material, planarizing the material for the dummy gate electrode layer 112, and patterning the dielectric material and the material for the dummy gate electrode layer 112 into the dummy gate structures $108_{1-5}$. The material for the dummy gate electrode layer 112 and the dielectric material, uncovered by the patterned hard mask layer, is etched away until the source/drain regions of the active regions 104A and 104B are exposed, in accordance with some embodiments.

Gate spacer layers 114 are formed along the opposite sidewalls of the dummy gate structures $108_{1-5}$, as shown in FIGS. 2A-1 and 2A-2, in accordance with some embodiments. The gate spacer layers 114 extend in the Y direction and across the active regions 104A and 104B and the isolation structure 106, in accordance with some embodiments. The gate spacer layers 114 are used to offset the subsequently formed source/drain features and separate the source/drain features from the gate structure, in accordance with some embodiments. In some embodiments, the gate spacer layers 114 are made of dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the gate spacer layers 114 are made of low-k dielectric materials. For example, the dielectric constant (k) value of the gate spacer layers 114 may be lower than a k-value of silicon oxide (SiO), such as lower than 4.2, equal to or lower than about 3.9, such as in a range from about 3.5 to about 3.9.

In some embodiments, the formation of the gate spacer layers 114 includes globally and conformally depositing a dielectric material for the gate spacer layers 114 over the semiconductor structure 100, followed by an anisotropic etching process. In some embodiments, the etching process is performed without an additional photolithography process. The portions of the dielectric material that remain on the sidewalls of the dummy gate structures $108_{1-5}$ serve as the gate spacer layers 114, in accordance with some embodiments.

Source/drain features 116 are formed in and/or over the source/drain regions of the active regions 104A and 104B, as shown in FIGS. 2A-1 and 2A-2, in accordance with some embodiments. The formation of the source/drain features 116 includes recessing the source/drain regions of the active regions 104A and 104B using the dummy gate structures $108_{1-5}$ and the gate spacer layers 114 as masks to form source/drain recesses on opposite sides of the dummy gate structures $108_{1-5}$, in accordance with some embodiments. The source/drain recesses extend into the lower portions 104L of the active regions 104A and 104B, in accordance with some embodiments.

Afterward, the source/drain features 116 are grown on the exposed surfaces of the active regions 104A and 104B in the source/drain recesses using an epitaxial growth process, in accordance with some embodiments. The epitaxial growth process may be molecular beam epitaxy (MBE), metal organic chemical vapor deposition (MOCVD), vapor phase epitaxy (VPE), or another suitable technique. In some embodiments, the source/drain features 116 are made of any suitable material for an n-type semiconductor device and a p-type semiconductor device, such as Ge, Si, GaAs, AlGaAs, SiGe, GaAsP, SiP, SiC, SiCP, or a combination thereof. In some embodiments, the source/drain features 116 shown in FIG. 2A-1 are grown on another active region 104 that is not illustrated in the figures. After the epitaxial material of the source/drain features 116 grows beyond the source/drain recesses, the source/drain feature 116 begins to grow laterally over the isolation structure 106, as shown in FIG. 2A-1, in accordance with some embodiments.

In some embodiments, the source/drain features 116 are in-situ doped during the epitaxial growth process. For example, the n-type source/drain features for n-type semiconductor devices are doped with the n-type dopant during the epitaxial growth process. For example, the n-type dopant may be phosphorous (P) or arsenic (As). For example, the n-type source/drain features may be the epitaxially grown silicon phosphorous (SiP), silicon carbon (SiC), silicon phosphorous carbon (SiPC), silicon phosphorous arsenic (SiPAs), silicon arsenic (SiAs), silicon (Si) or a combination thereof doped with phosphorous and/or arsenic. For example, the p-type source/drain features for p-type semiconductor devices are doped with the p-type dopant during the epitaxial growth process. For example, the p-type dopant may be boron (B) or $BF_2$. For example, the p-type source/drain features may be the epitaxially grown silicon germanium (SiGe), silicon germanium carbon (SiGeC), germanium (Ge), silicon (Si) or a combination thereof doped with boron (B).

A contact etching stop layer 118 is formed over the semiconductor structure 100 to cover the source/drain features 116, as shown in FIGS. 2A-1 and 2A-2, in accordance with some embodiments. In some embodiments, the contact etching stop layer 118 further extends along, and covers, the top surface of the isolation structure 106 and the sidewalls of the gate spacer layers 114. The term "etching stop layer" used herein refers to a layer that may provide a mechanism to stop or slow down an etching process when forming, e.g., openings, holes, trenches, etc. In some embodiments, the contact etching stop layer 118 is made of dielectric material, such as silicon nitride (SiN), silicon oxynitride (SiON), silicon oxide ($SiO_2$), silicon carbide (SiC), oxygen-doped silicon carbide (SiC:O), oxygen-doped silicon carbonitride (Si(O)CN), or a combination thereof. In some embodiments, a dielectric material for the contact etching stop layer 118 is globally and conformally deposited using CVD (such as LPCVD, PECVD, HDP-CVD, or HARP), ALD, another suitable method, or a combination thereof.

A first interlayer dielectric layer 120 is formed over the contact etching stop layer 118, as shown in FIGS. 2A-1 and 2A-2, in accordance with some embodiments. In some embodiments, the first interlayer dielectric layer 120 is made of dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), or another suitable dielectric material. In some embodiments, the first interlayer dielectric layer 120 and the contact etching stop layer 118 are made of different materials and have a great difference in etching selectivity. In some embodiments, the dielectric material for the first interlayer dielectric layer 120 is deposited using such as CVD (such as HDP-CVD, PECVD, HARP or FCVD), another suitable technique, and/or a combination thereof. The dielectric materials for the contact etching stop layer 118 and the first interlayer dielectric layer 120 above the top surfaces of the dummy gate structures $108_{1-5}$ are removed using such as CMP, in accordance with some embodiments.

Figure 2B:
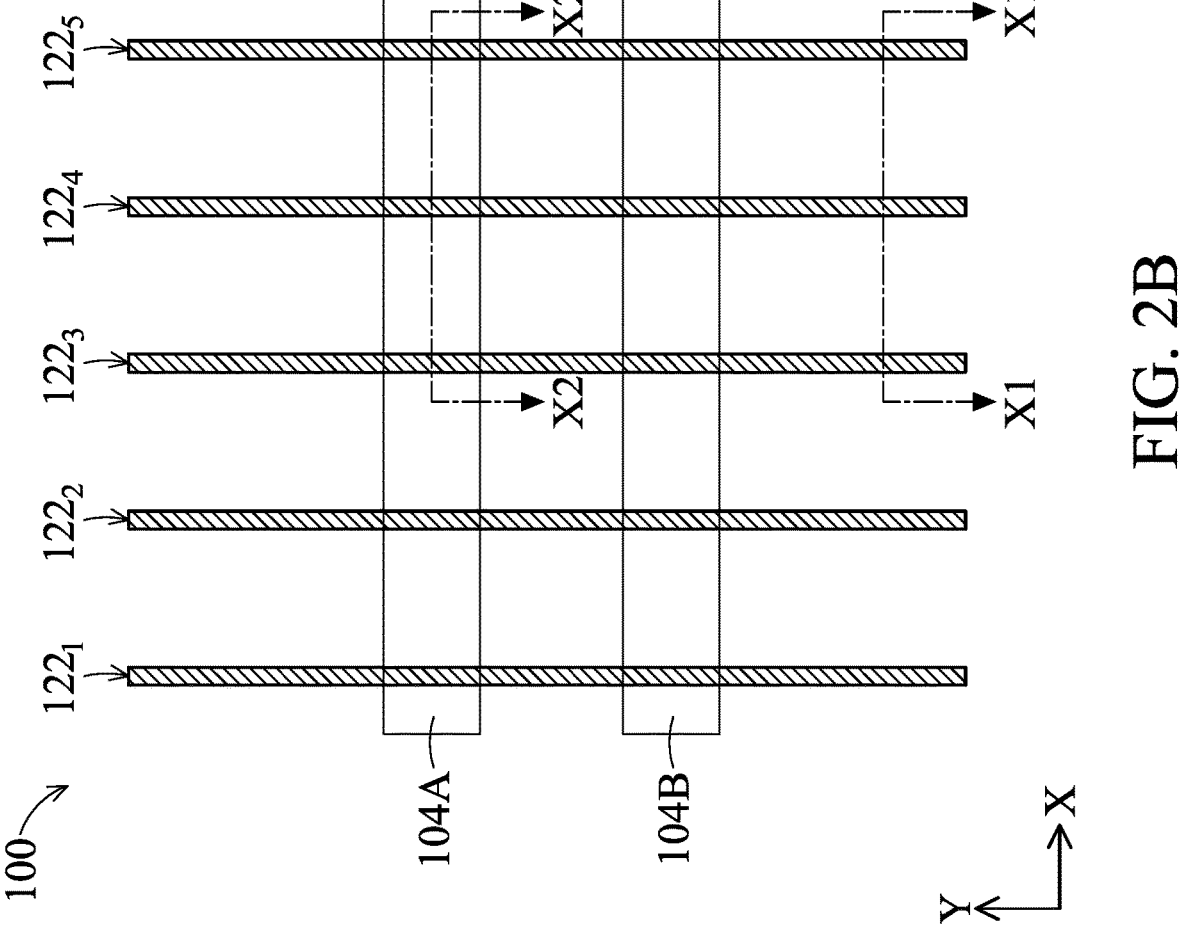
Figures 2, 2B:
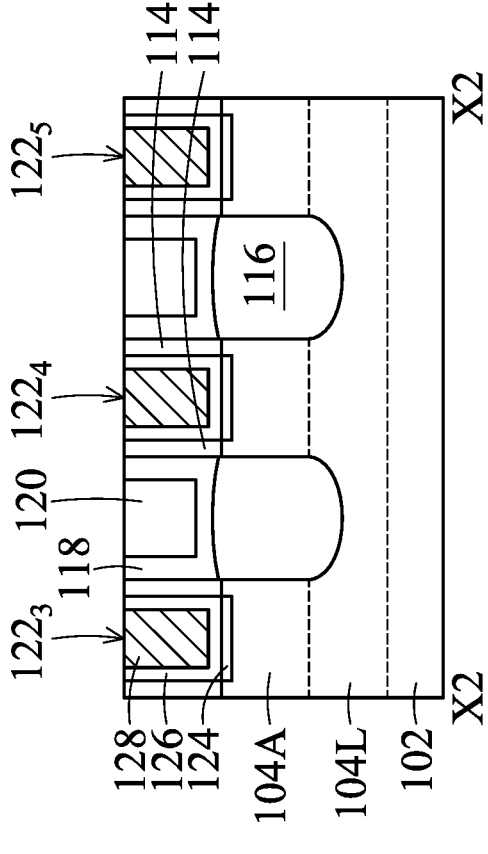
Figures 1, 2B:
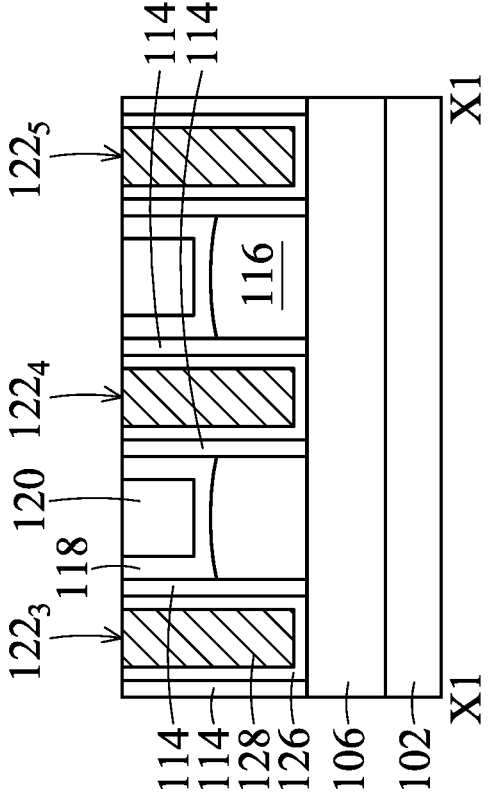

FIGS. 2B through 2B-2 illustrate a semiconductor structure 100 after the formation of final gate stacks 122, in accordance with some embodiments. FIGS. 2B-1 and 2B-2 are cross-sectional views corresponding to line X1-X1 and line X2-X2 of FIG. 2B, respectively.

The dummy gate structures $108_{1-5}$ are removed using one or more etching processes to form gate trenches (not shown), in accordance with some embodiments. The gate trenches expose the channel regions of the active regions 104A and 104B, in accordance with some embodiments. The gate trenches also expose the inner sidewalls of the gate spacer layers 114 facing the channel regions, in accordance with some embodiments. In some embodiments, the etching process includes one or more etching processes. For example, when the dummy gate electrode layer 112 is made of polysilicon, a wet etchant such as a tetramethylammonium hydroxide (TMAH) solution may be used to selectively remove the dummy gate electrode layer 112. For example, the dummy gate dielectric layer 110 may be thereafter removed using a plasma dry etching, a dry chemical etching, and/or a wet etching.

Figure 2C:
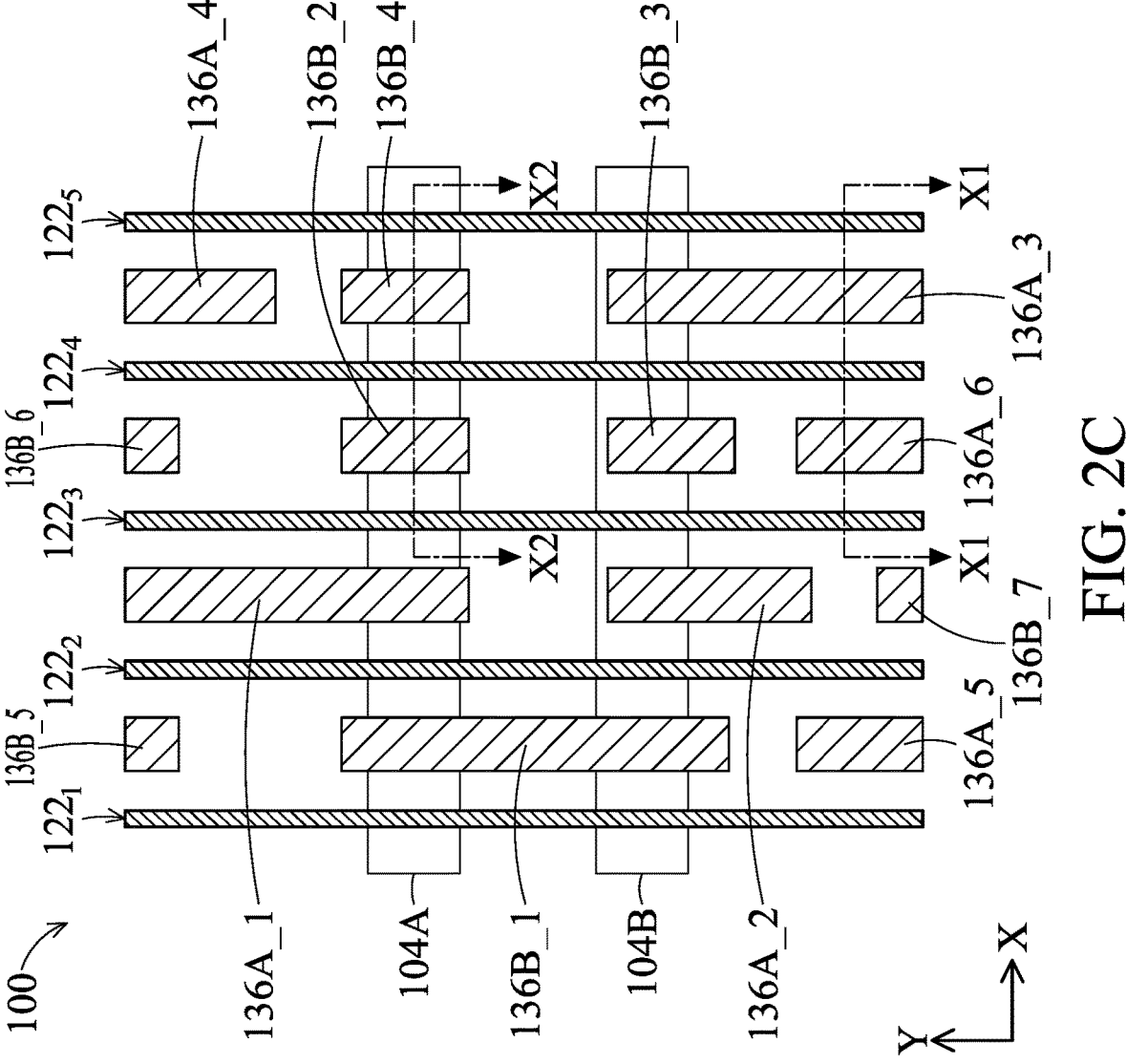
Figures 2, 2C:
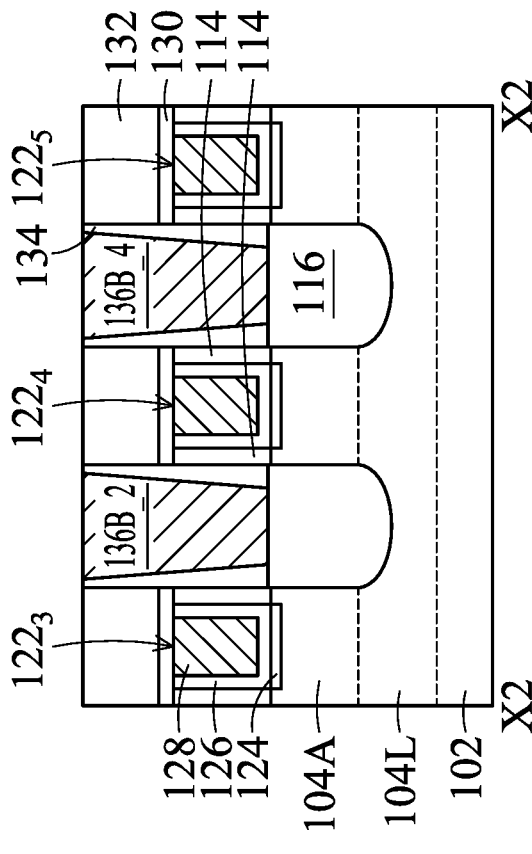
Figures 1, 2C:
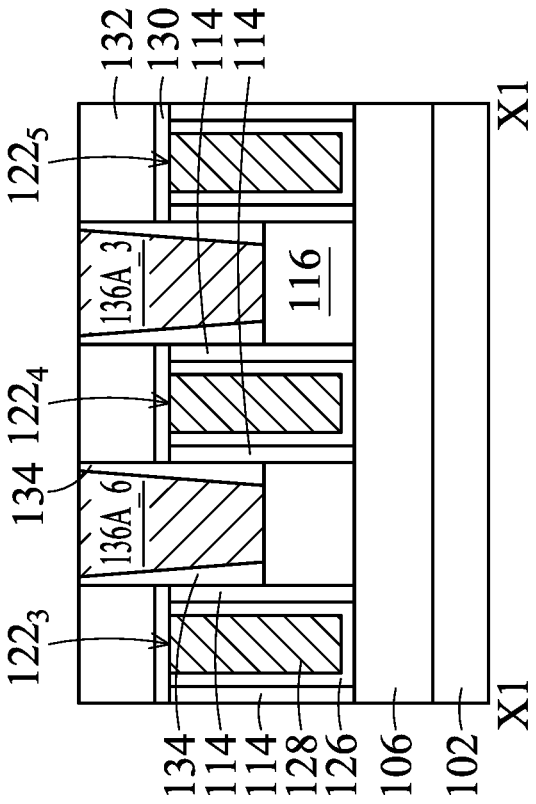
Figure 2D:
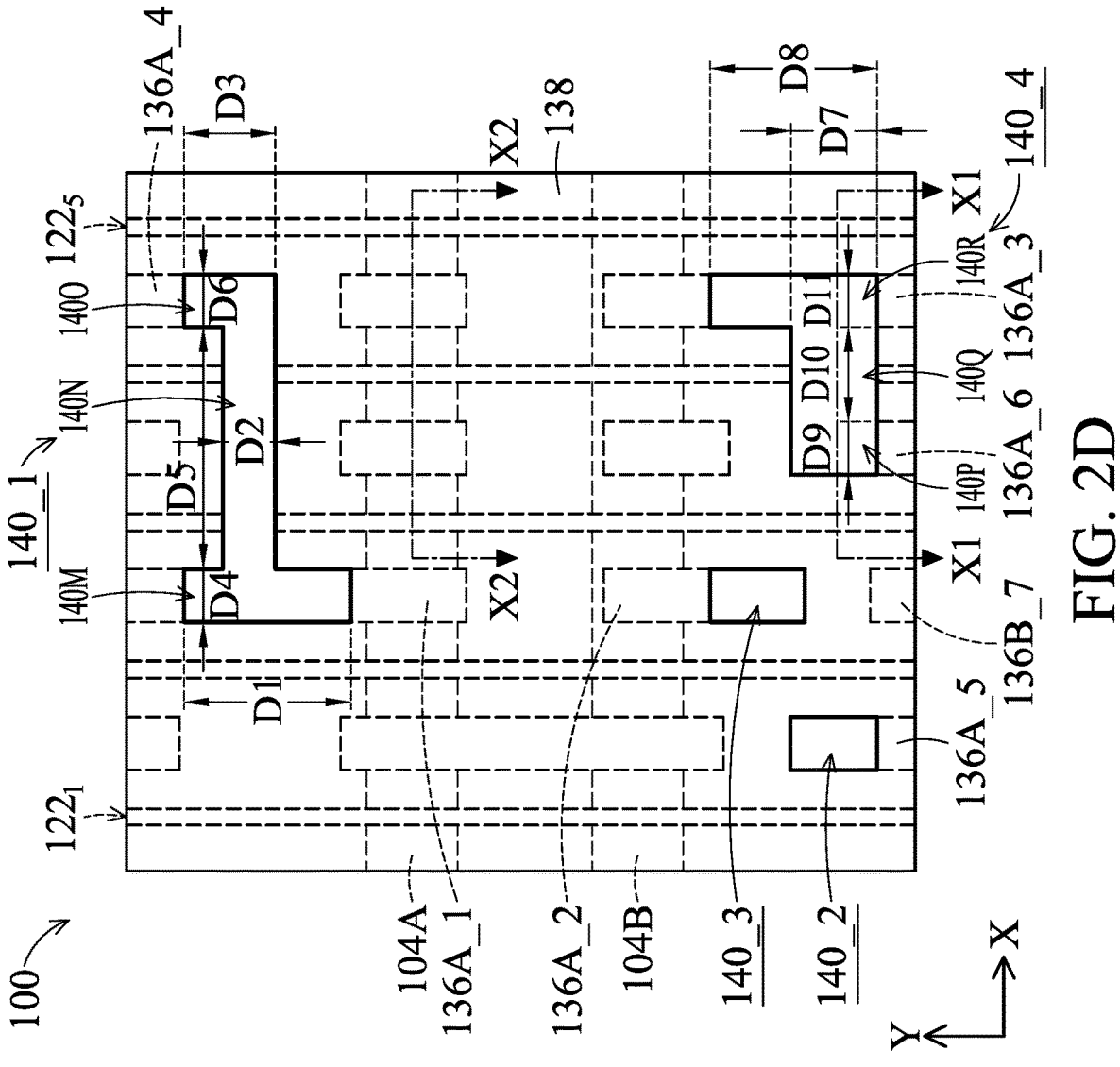
Figures 2, 2D:
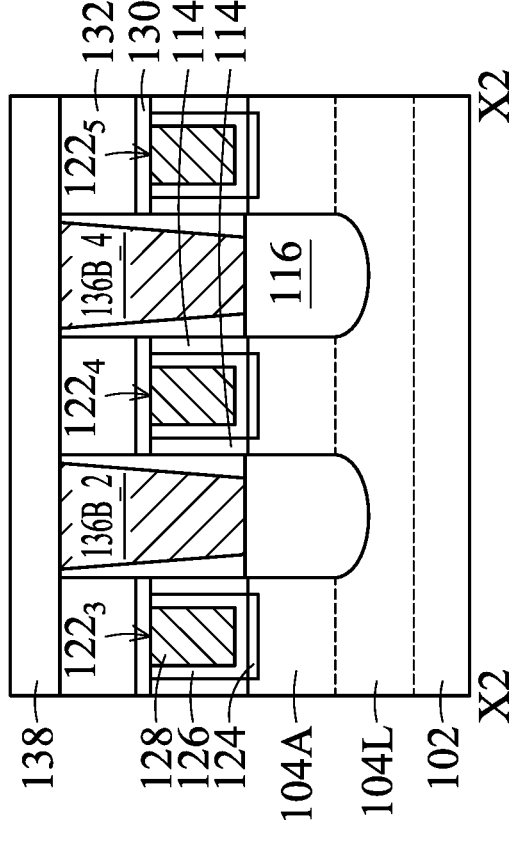
Figures 1, 2D:
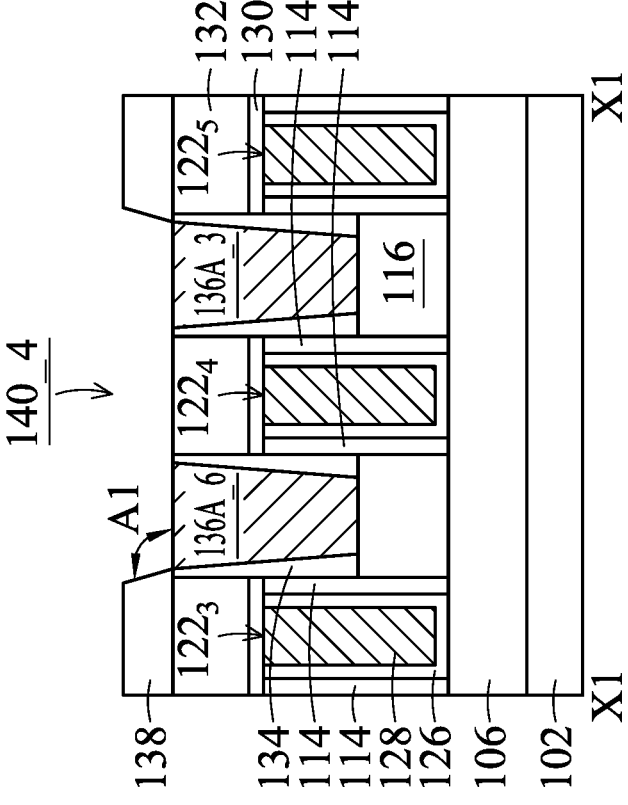
Figures 2, 2E:
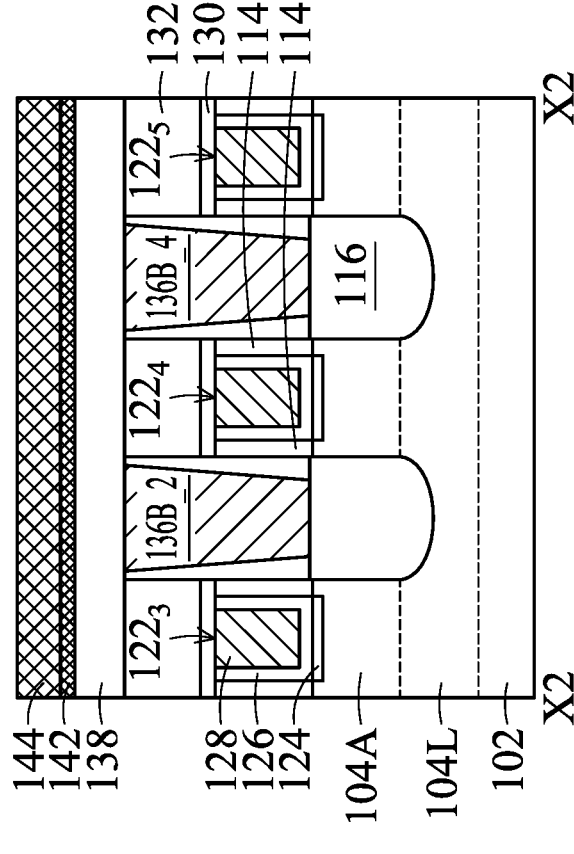
Figures 1, 2E:
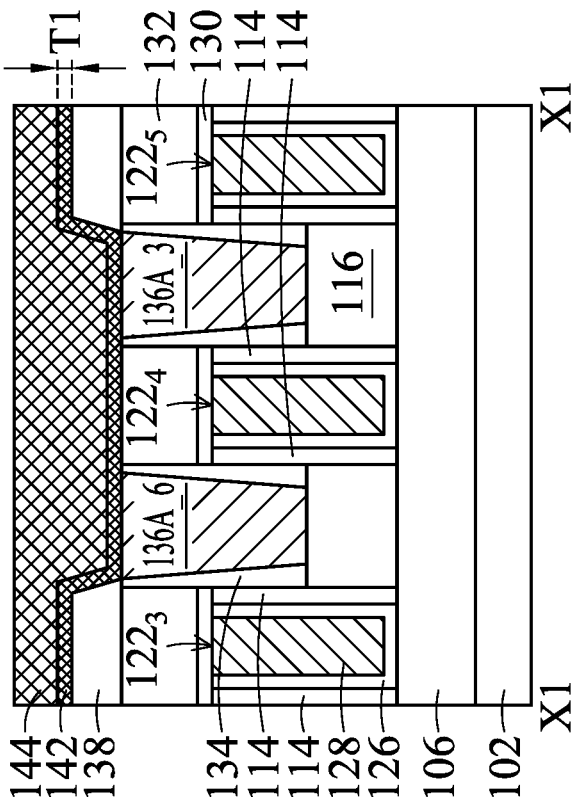
Figure 2F:
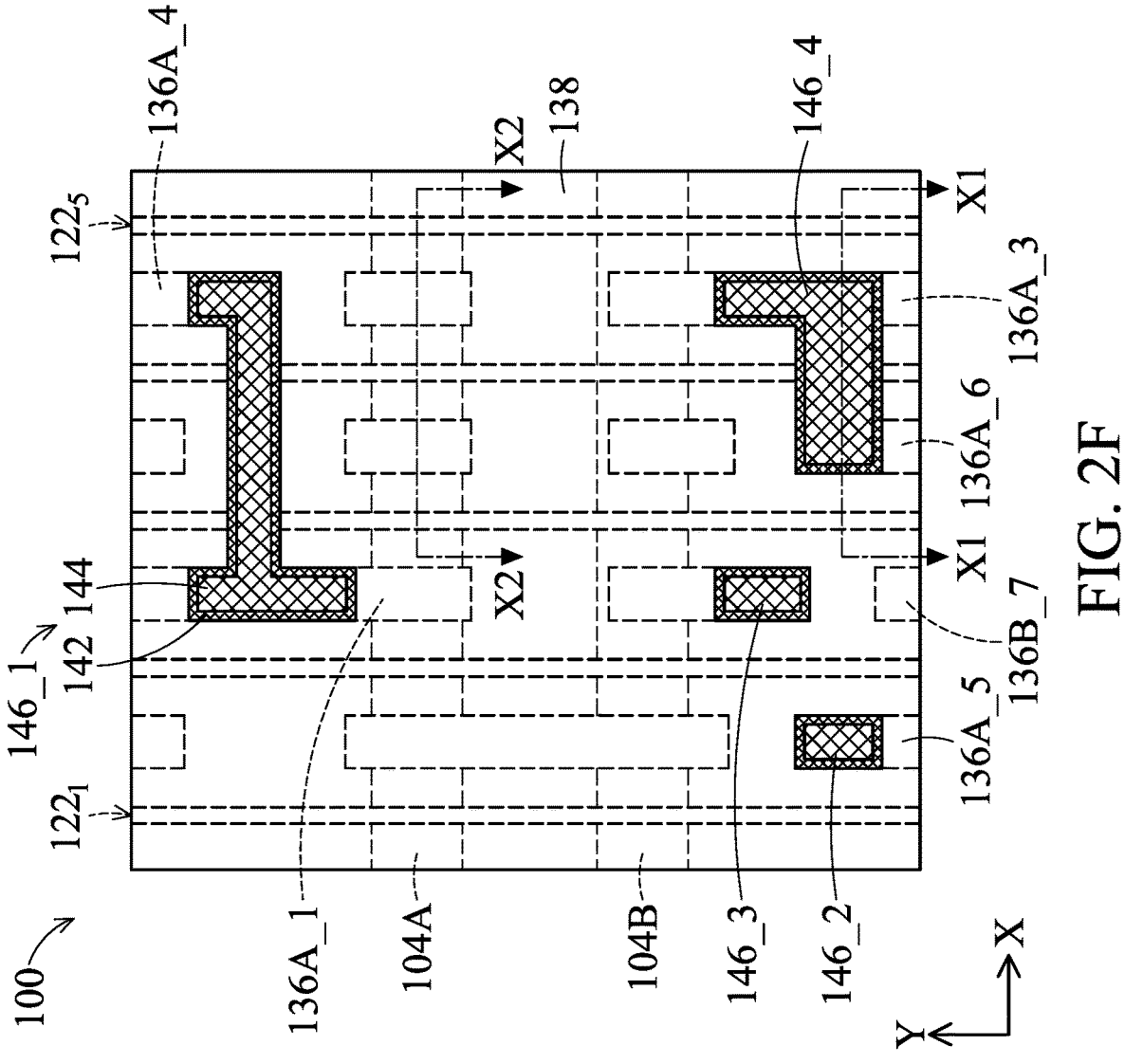
Figures 2, 2F:
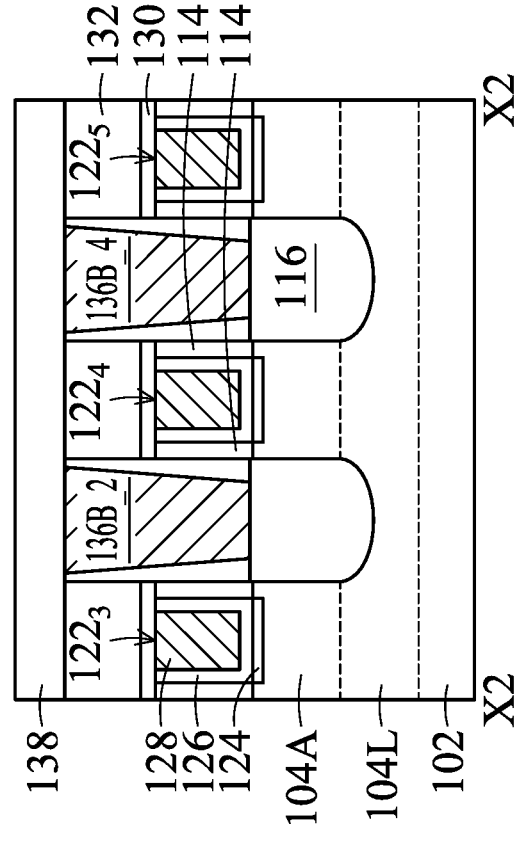
Figures 1, 2F:
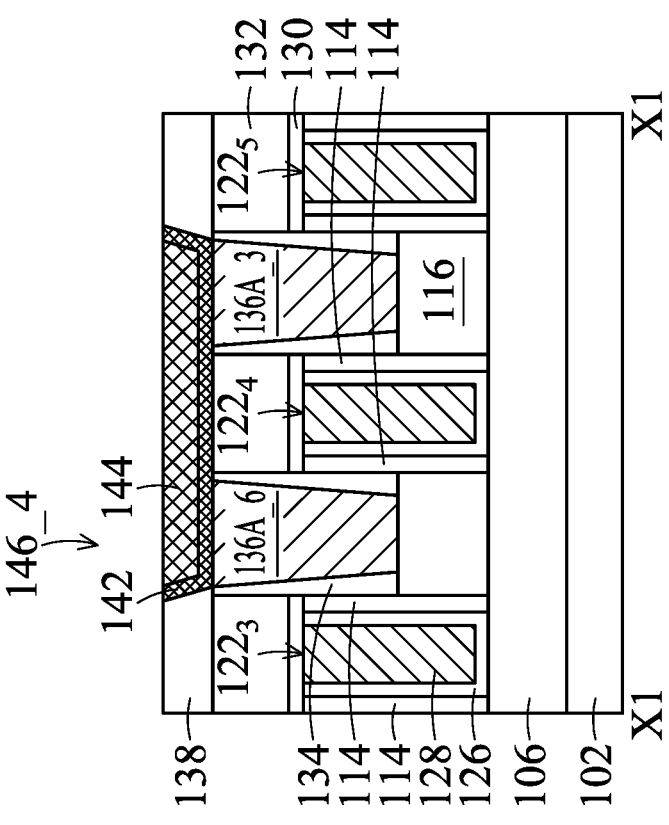
Figure 2G:
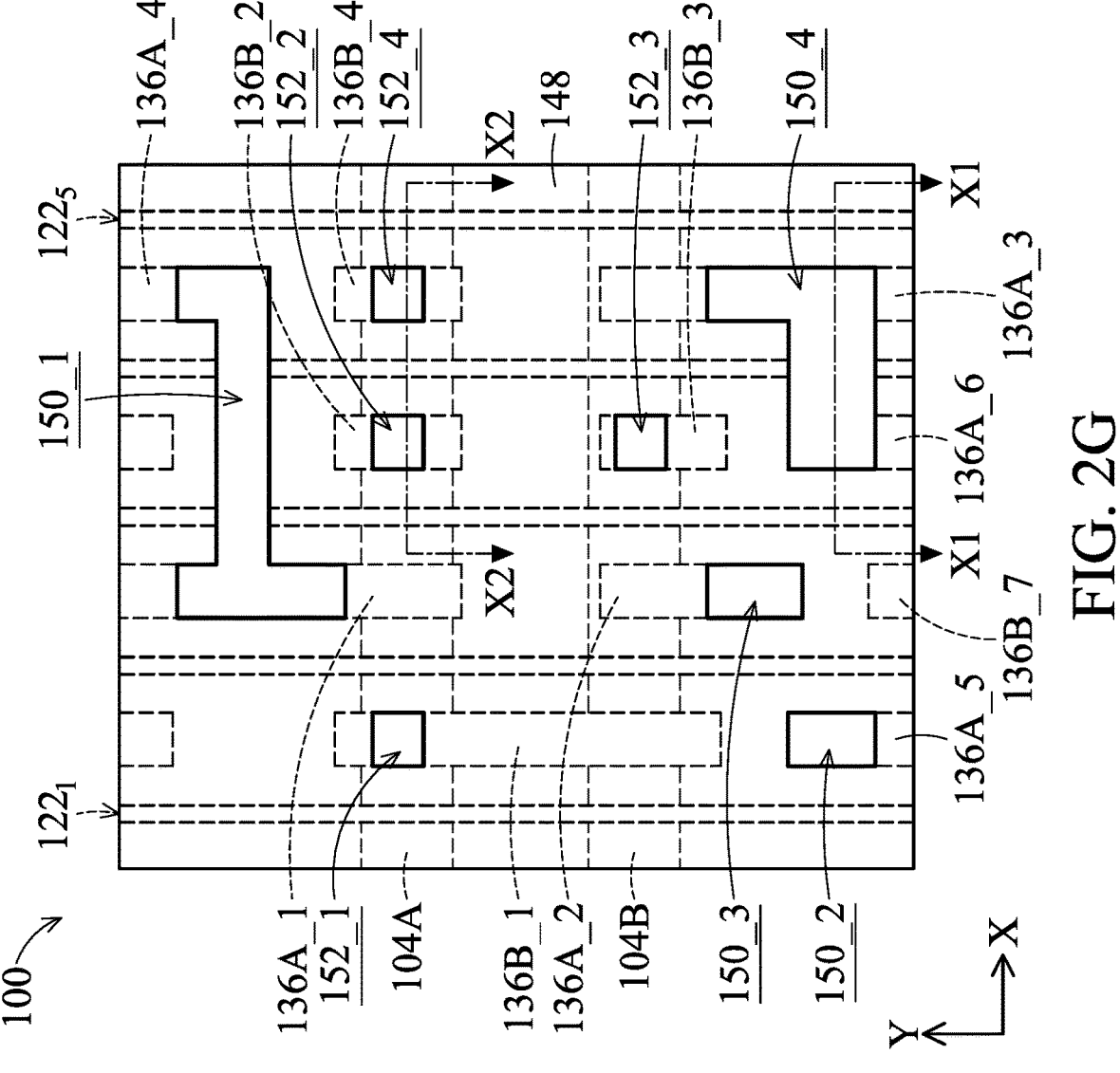
Figures 1, 2G:
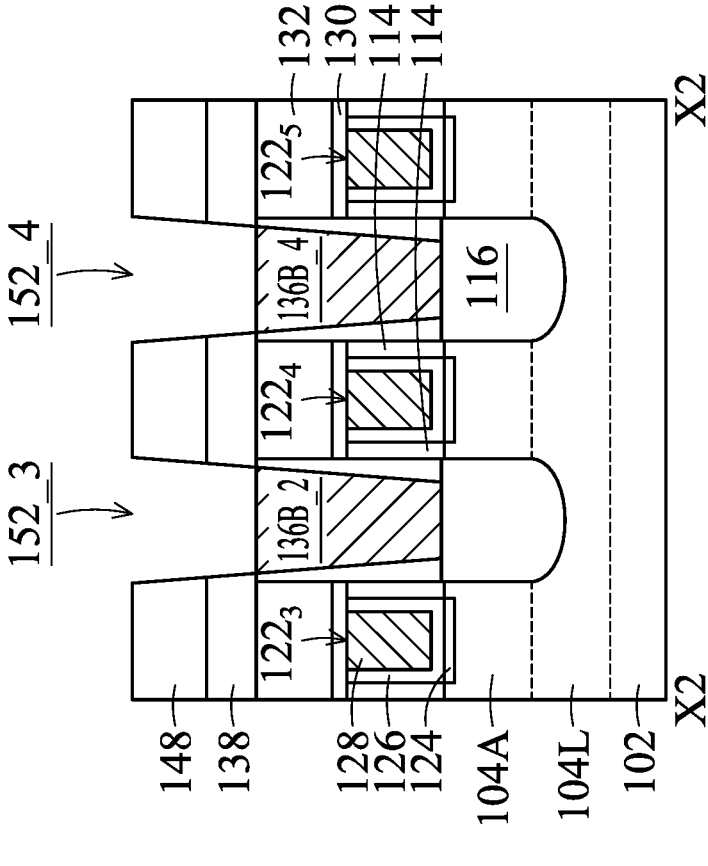
Figures 2, 2G:
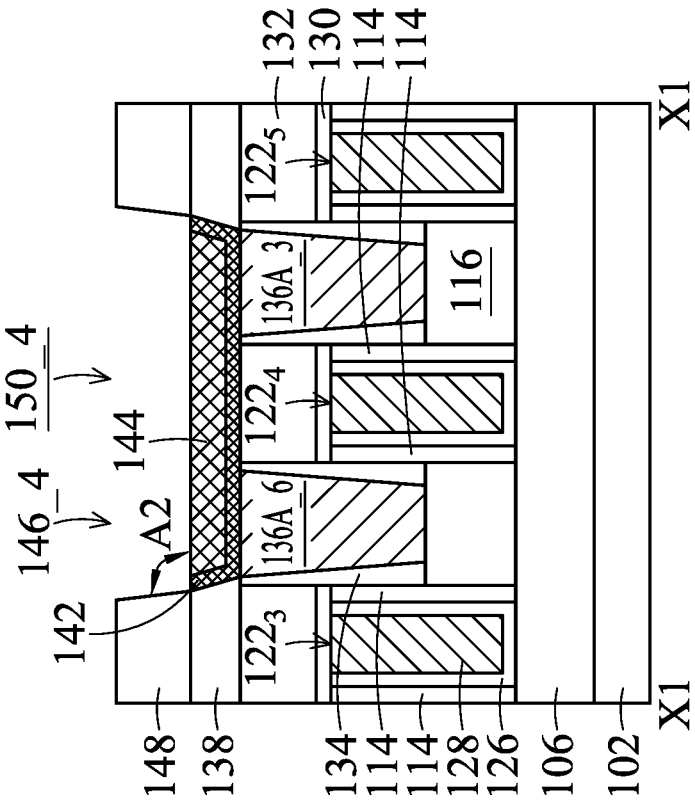
Figures 1, 2H:
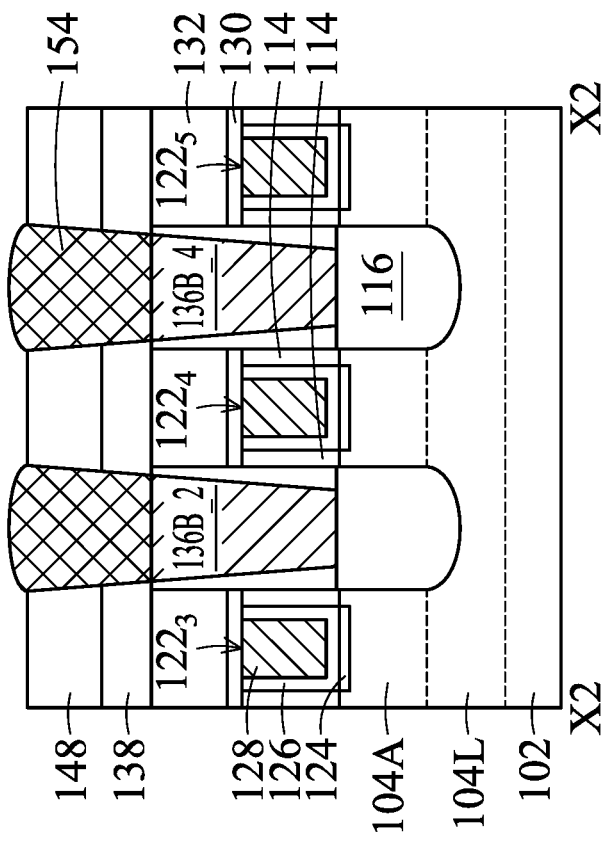
Figures 2, 2H:
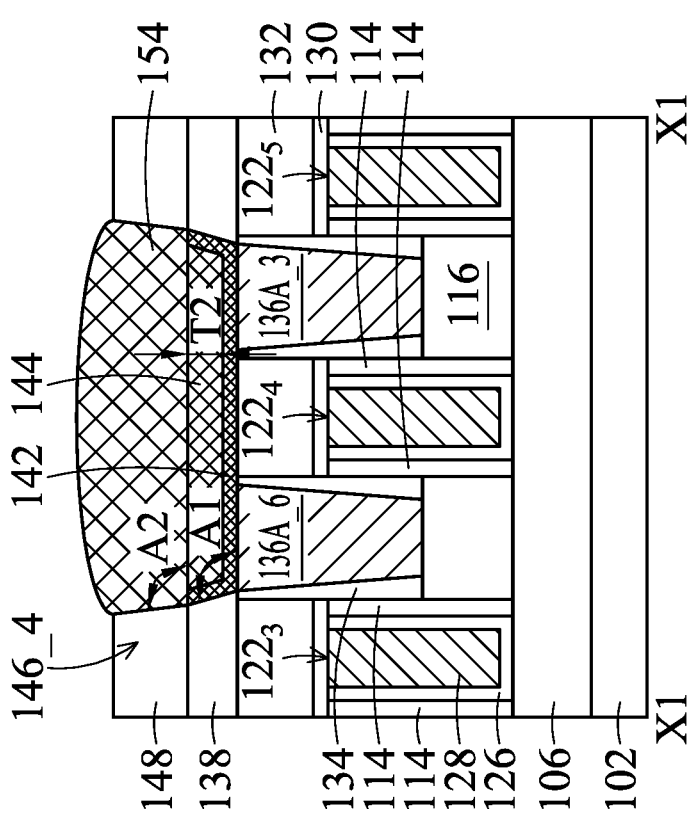
Figure 2I:
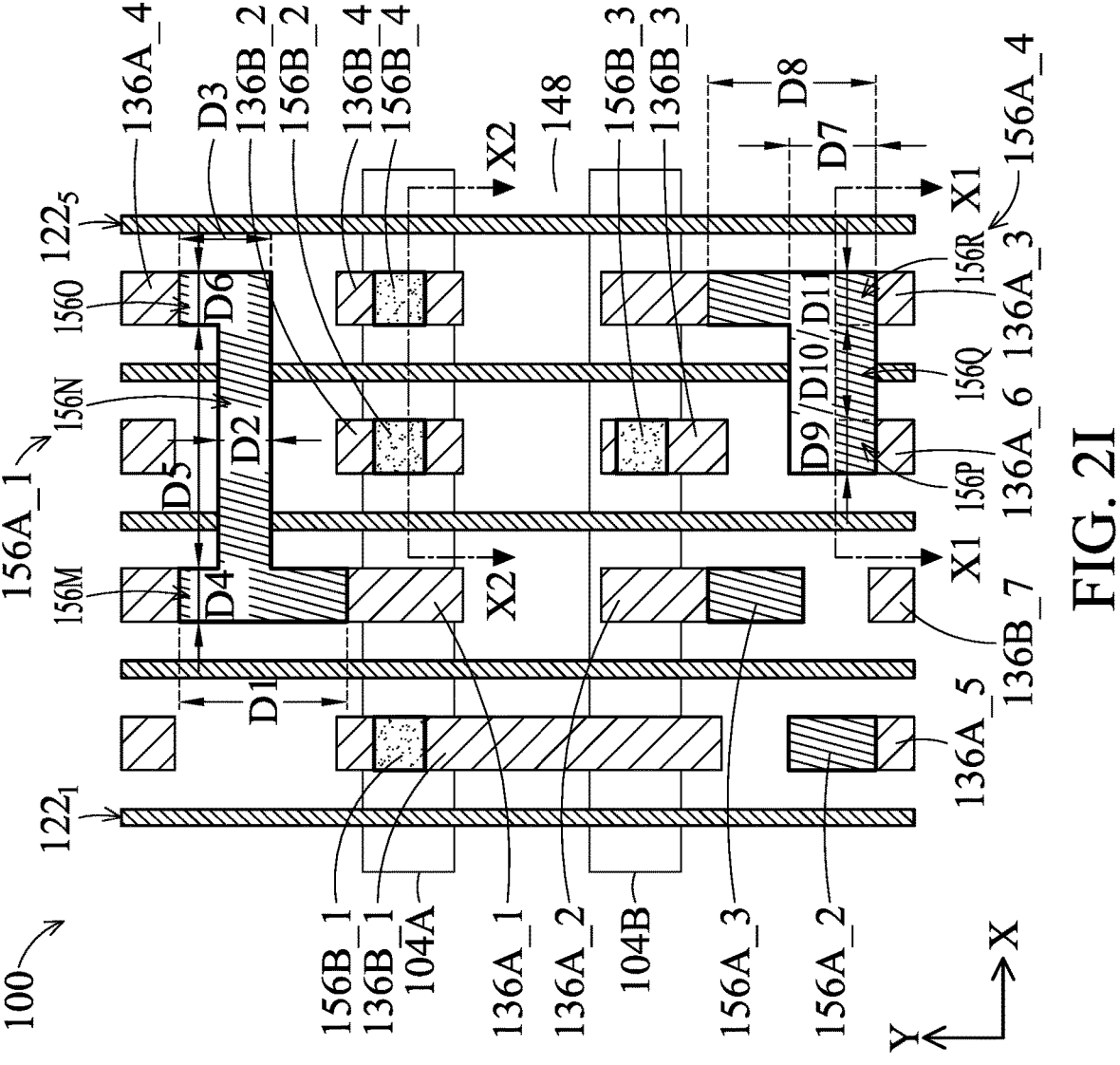
Figures 1, 2I:
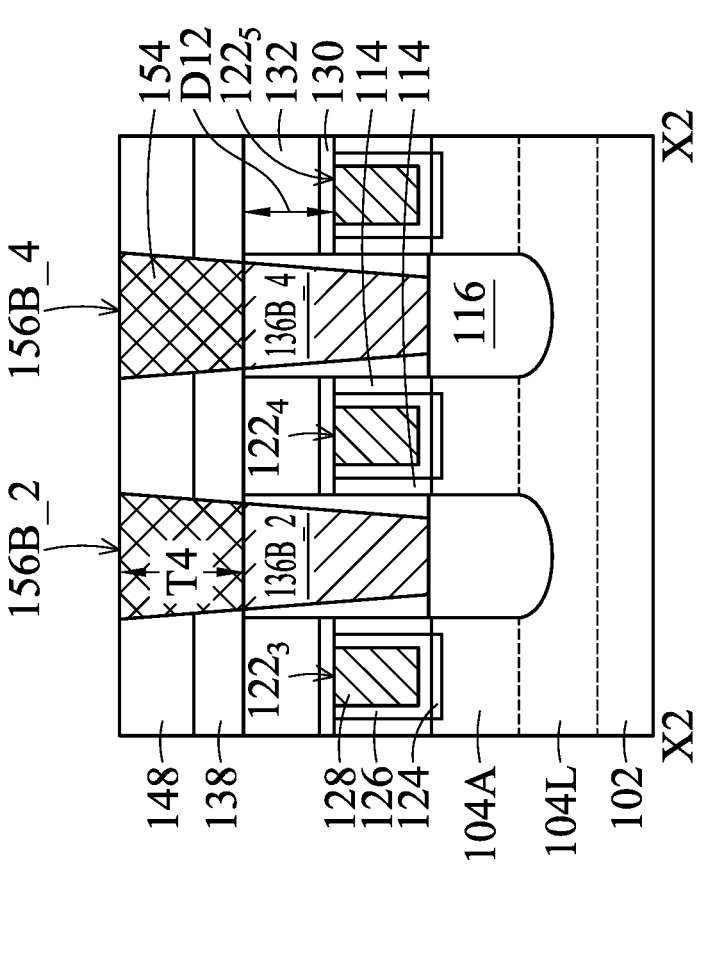
Figures 2, 2I:
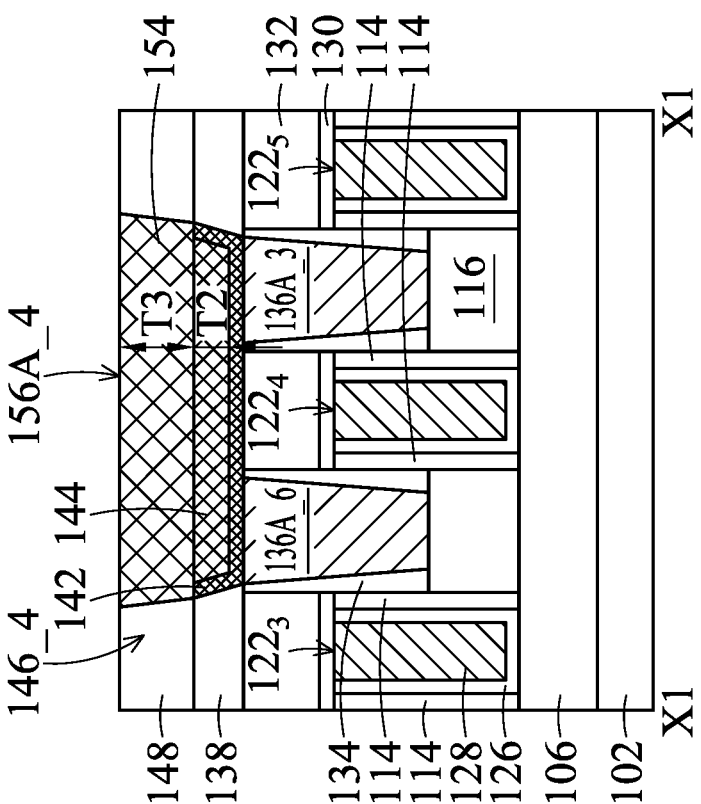
Figure 2J:
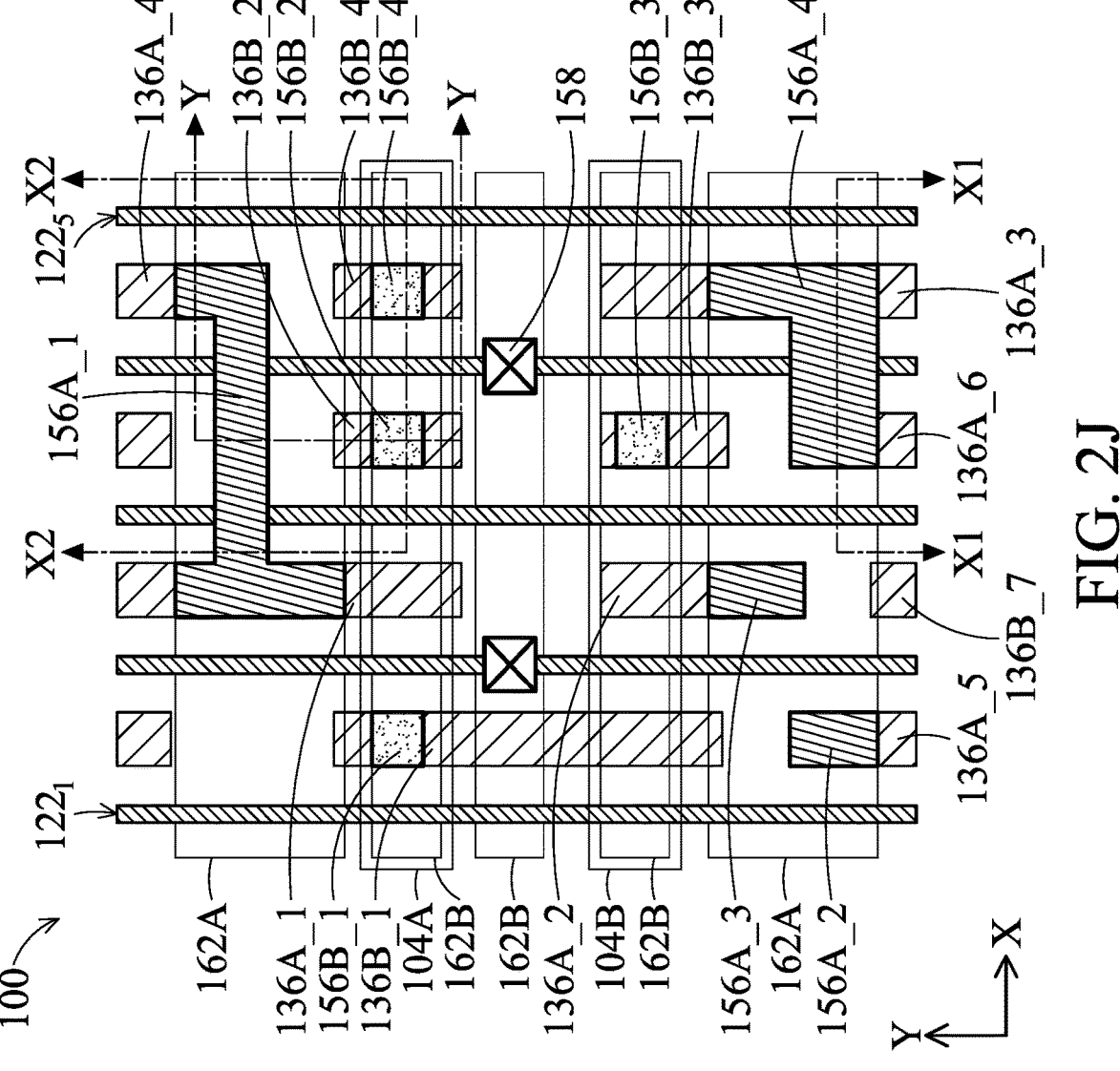
Figures 2, 2J:
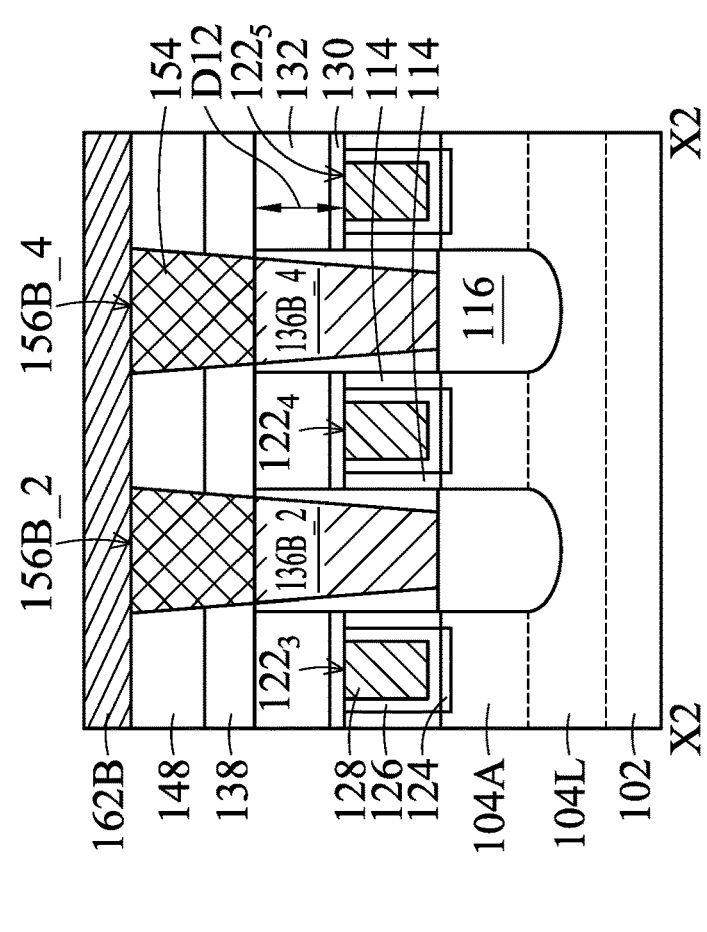
Figures 1, 2J:
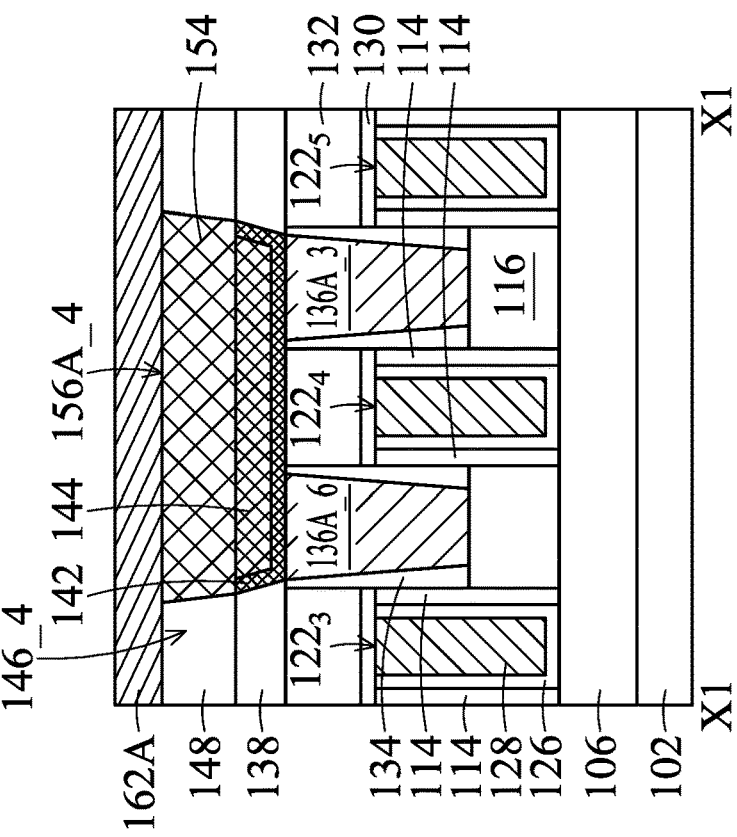
Figures 2, 2J, 3:
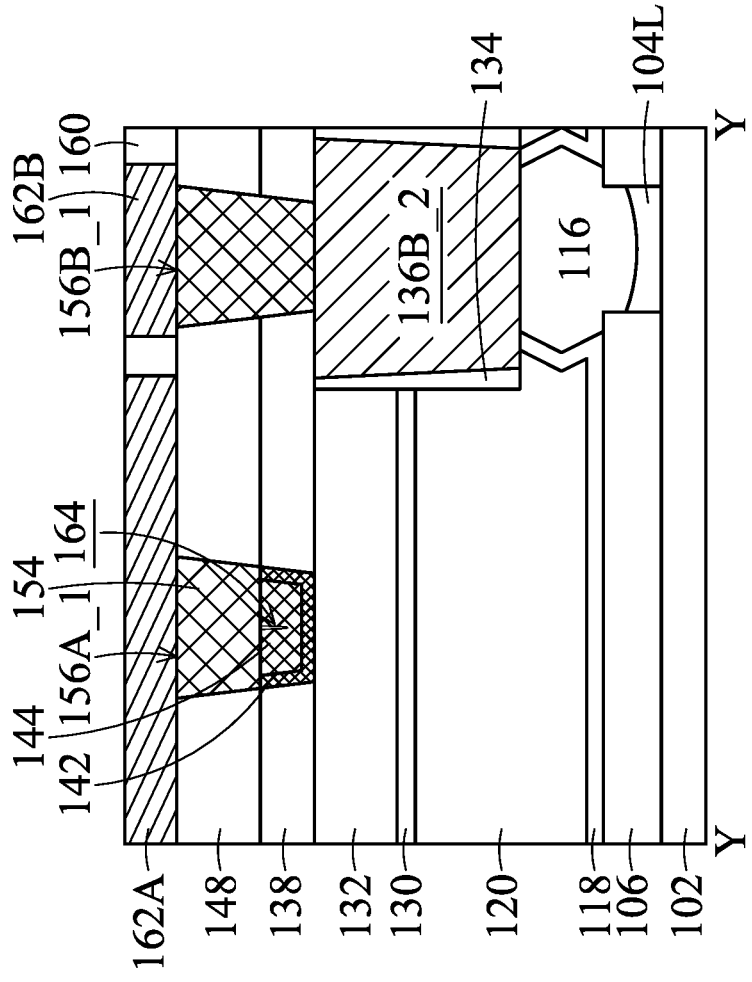
Figure 3:
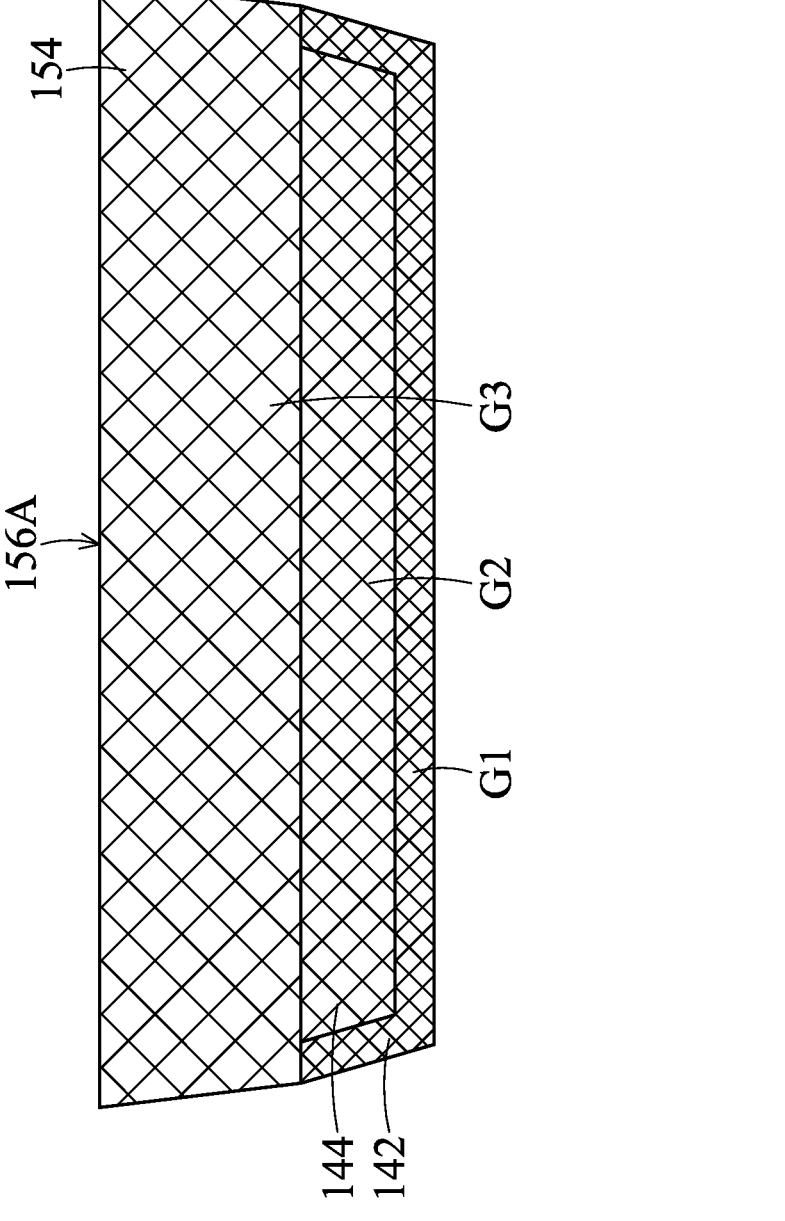

Final gate stacks $122_{1-5}$ are formed in the gate trenches, as shown in FIGS. 2B through 2B-3, in accordance with some embodiments. The final gate stacks $122_{1-5}$ extend across the active regions 104A and 104B and the isolation structure 106, in accordance with some embodiments. The final gate stacks $122_{1-5}$ surround the channel regions of the active regions 104A and 104B, in accordance with some embodiments. In some embodiments, the final gate stacks $122_{1-5}$ extend in the Y direction. The final gate stacks $122_{1-5}$ have longitudinal axes parallel to the Y direction, in accordance with some embodiments. That is, the dimensions (lengths) of the final gate stacks $122_{1-5}$ in the Y direction are greater than the dimensions (widths) of the final gate stacks $122_{1-5}$ in the X direction.

In some embodiments, each of the final gate stacks $122_{1-5}$ includes an interfacial layer 124, a gate dielectric layer 126 and a metal gate electrode layer 128, as shown in FIGS. 2B-1 and 2B-2, in accordance with some embodiments. The interfacial layer 124 is formed on the exposed surfaces of the active regions 104A and 104B, in accordance with some embodiments. In some embodiments, the interfacial layer 124 is made of a chemically formed silicon oxide. In some embodiments, the interfacial layer 124 is nitrogen-doped silicon oxide. In some embodiments, the interfacial layer 124 is formed using one or more cleaning processes such as including ozone (03), ammonia hydroxide-hydrogen peroxide-water mixture, and/or hydrochloric acid-hydrogen peroxide-water mixture. Semiconductor material from the active regions 104A and 104B is oxidized to form the interfacial layer 124, in accordance with some embodiments.

The gate dielectric layer 126 is formed over the interfacial layer 124 to partially fill the gate trenches, in accordance with some embodiments. The gate dielectric layer 126 is further formed along the upper surface of the isolation structure 106, in accordance with some embodiments. The gate dielectric layer 126 is also conformally formed along the sidewalls of the gate spacer layers 114 facing the channel region, in accordance with some embodiments. The gate dielectric layer 126 may be high-k dielectric layer, in accordance with some embodiments. In some embodiments, the high-k dielectric layer is made of a dielectric material with a high dielectric constant (k value); higher than 3.9, for example, greater than 9, such as greater than 13. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba, Sr) $TiO_3$ (BST), $Al_2O_3$, $Si_3N_4$, oxynitrides (SiON), another suitable material, or a combination thereof. The high-k dielectric layer may be deposited using ALD, PVD, CVD, or another suitable technique.

The metal gate electrode layer 128 is formed over the gate dielectric layer 126 to overfill remainders of the gate trenches, in accordance with some embodiments. The metal gate electrode layer 128 is nested within the gate dielectric layer 126, in accordance with some embodiments. In some embodiments, the metal gate electrode layer 128 is made of more than one conductive material, such as a metal, metal alloy, conductive metal oxide and/or metal nitride, another suitable conductive material, and/or a combination thereof. For example, the metal gate electrode layer 128 may be made of Ti, Ag, Al, TiAlN, TaC, TaCN, TaSlN, Mn, Zr, TiN, TaN, Ru, Mo, WN, Cu, W, Re, Ir, Co, Ni, another suitable conductive material, or multilayers thereof.

The metal gate electrode layer 128 may be a multi-layer structure with various combinations of a diffusion barrier liner, work function layers with a selected work function to enhance the device performance (e.g., threshold voltage) for n-channel FETs or p-channel FETs, a capping layer to prevent oxidation of work function layers, a glue layer to adhere work function layers to a next layer, and a metal fill layer to reduce the total resistance of gate stacks, or another suitable layer. The metal gate electrode layer 128 may be formed using ALD, PVD, CVD, e-beam evaporation, or another suitable technique. The metal gate electrode layer 128 may be formed separately for n-channel FinFETs and p-channel FinFETs, which may use different work function materials.

A planarization process such as CMP may be performed on the semiconductor structure 100 to remove the materials of the gate dielectric layer 126 and the metal gate electrode layer 128 formed above the top surface of the first interlayer dielectric layer 120, in accordance with some embodiments. After the planarization process, the top surfaces of the metal gate electrode layer 128, the gate spacer layers 114, the contact etching stop layer 118 and the first interlayer dielec-tric layer 120 are substantially coplanar, in accordance with some embodiments. Portions of the final gate stacks 122 surrounding the channel regions of the active regions 104 combine with the neighboring source/drain features 116 to form functional transistors (e.g., p-channel FinFETs or n-channel FinFETs), in accordance with some embodiments. The final gate stacks 122 engage the channel so that current can flow between the source/drain features 116 during operation.

FIGS. 2C through 2C-2 illustrate a semiconductor struc-ture 100 after the formation of an etching stop layer 130, a second interlayer dielectric layer 132, contact liners 134 and contact plugs 136, in accordance with some embodiments. FIGS. 2C-1 and 2C-2 are cross-sectional views correspond-ing to line X2-X2 of FIG. 2C, respectively.

An etching stop layer 130 is formed over the semicon-ductor structure 100, as shown in FIGS. 2C-1 and 2C-2, in accordance with some embodiments. In some embodiments, the etching stop layer 130 is made of dielectric material, such as silicon nitride (SiN), silicon oxynitride (SiON), silicon oxide ($SiO_2$), silicon carbide (SiC), oxygen-doped silicon carbide (SiC:O), oxygen-doped silicon carbonitride (Si(O)CN), or a combination thereof. In some embodiments, a dielectric material for the etching stop layer 130 is depos-ited using CVD (such as LPCVD, PECVD, HDP-CVD, or HARP), ALD, another suitable method, or a combination thereof.

A second interlayer dielectric layer 132 is formed over the semiconductor structure 100, as shown in FIGS. 2C-1 and 2C-2, in accordance with some embodiments. In some embodiments, the second interlayer dielectric layer 132 is made of dielectric material, such as USG, BPSG, FSG, PSG, BSG, or another suitable dielectric material. In some embodiments, the second interlayer dielectric layer 132 and etching stop layer 130 are made of different materials and have a great difference in etching selectivity. In some embodiments, the second interlayer dielectric layer 132 is deposited using such as CVD (such as HDP-CVD, PECVD, HARP or FCVD), another suitable technique, or a combi-nation thereof.

Contact plugs 136 (including 136A and 136B) are formed in and/or through the second interlayer dielectric layer 132, the etching stop layer 130, the first interlayer dielectric layer 120 and the contact etching stop layer 118 and land on the source/drain features 116, as shown in FIGS. 2C through 2C-2, in accordance with some embodiments. The contact plugs 136A and 136B are electrically connected to the source/drain features 116, in accordance with some embodi-ments. In some embodiments, the contact plugs 136 extend in the Y direction. The contact plugs 136 have longitudinal axes parallel to the Y direction, in accordance with some embodiments. That is, the dimensions (lengths) of the contact plugs 136 in the Y direction are greater than the dimensions (widths) of the contact plugs 136 in the X direction.

In some embodiments, the contact plugs 136A (including 136A_1 to 136_6) land on the source terminals of the functional transistors and may be also referred to as source contact plugs. In some embodiments, the contact plugs 136A are electrically connected to subsequently formed power supply lines. In some embodiments, the contact plug 136A_1 lands on the source region of the active region 104A. In some embodiments, the contact plugs 136A_2 and 136A_3 land on the source regions of the active region 104B. The contact plugs 136A_4, 136A_5 and 136A_6 may land on the source regions of other active regions that are not illustrated in the figures. In some embodiments, the contact plug 136A_1 and 136A_3 may be shared by two active regions and thus have longer dimension in the Y direction.

In some embodiments, the contact plugs 136B (including 136B$_{1-7}$) land on the drain terminals of the functional transistors and may be also referred to as drain contact plugs. In some embodiments, the contact plugs 136B are electri-cally connected to subsequently formed signal lines. In some embodiments, the contact plugs 136B_1, 136B_2 and 136B_4 land on the drain regions of the active region 104A. In some embodiments, the contact plugs 136B_1 and 136B_3 land on to the drain regions of the active region 104B. The contact plugs 136B_5, 136B_6 and 136B_7 may land on the drain regions of other active regions that are not illustrated in the figures. In some embodiments, the contact plug 136B_1 is shared by the active regions 104A and 104B and thus has longer dimension in the Y direction.

In some embodiments, the formation of the contact plugs 136 includes patterning the second interlayer dielectric layer 132, the etching stop layer 130, the first interlayer dielectric layer 120 and the contact etching stop layer 118 to form contact openings (where the contact plugs 136 are to be formed) using photolithography and etching processes until the source/drain features 116 are exposed. The portions of the contact etching stop layer 118 formed along the gate spacer layers 114 are entirely removed, thereby exposing the sidewalls of the gate spacer layers 114.

In some embodiments, the formation of the contact plugs 136 further includes forming contact liners 134 along the sidewalls (e.g., defined by the exposed surfaces of the second interlayer dielectric layer 132, the etching stop layer 130 and the gate spacer layers 114) of the contact openings using a deposition process and an etching back process, as shown in FIGS. 2C-1 and 2C-2, in accordance with some embodiments. In some embodiments, the contact liners 134 are made of an insulating material such as a dielectric material (e.g., SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO); or undoped silicon (Si).

In some embodiments, the formation of the contact plugs 136 further includes forming a silicide layer (such as WSi, NiSi, TiSi and/or CoSi) on the exposed source/drain features 116, depositing one or more conductive materials over the silicide layer to fill the remainder of the contact openings, and planarizing the one or more conductive materials until the top surface of the second interlayer dielectric layer 132 are exposed using, for example, CMP or an etching back process. In some embodiments, the conductive material is deposited using CVD, PVD, e-beam evaporation, ALD, electroplating (ECP), electroless deposition (ELD), another suitable method, or a combination thereof. After the planar-ization process, the top surfaces of the contact plugs 136 and the second interlayer dielectric layer 132 are substantially coplanar, in accordance with some embodiments.

The contact plugs 136 may have a multilayer structure including, for example, barrier liners, seed layers, metal bulk layers, another suitable layer, or a combination thereof. For example, a barrier liner (not shown) may optionally be deposited along the sidewalls and the bottom surfaces of the contact openings. The barrier liner is used to prevent the metal from the subsequently formed metal material from diffusing into the dielectric material (e.g., the second interlayer dielectric layer 132 and the first interlayer dielectric layer 120), and/or to improve adhesion between the subsequently formed metal material and the dielectric material (e.g., the second interlayer dielectric layer 132 and the first interlayer dielectric layer 120). The barrier liner may be made of conductive material such as titanium (Ti), titanium nitride (TiN), tungsten (W), tantalum (Ta), tantalum nitride (TaN), cobalt tungsten (CoW), tungsten nitride (WN), tungsten oxide (WO$_x$, here 0<x<1), aluminum oxide (AlO$_x$, here 0<x<1), another metal oxidation, another metal nitridation, another metal compound, another suitable material, or a combination thereof.

In some embodiments, the metal bulk layer is formed on the barrier liner (if formed) to overfill the contact opening. In some embodiments, the metal bulk layer is formed using a selective deposition technique in a bottom-up manner, such as cyclic CVD process, cyclic ALD, or ELD process, and it is not necessary to form a barrier liner in the contact openings before depositing the metal bulk material. In some embodiments, the metal bulk layer is made of one or more conductive materials with low resistance and good gap-fill ability, for example, cobalt (Co), tungsten (W), ruthenium (Ru), molybdenum (Mo), aluminum (Al), nickel (Ni), titanium (Ti), tantalum (Ta), copper (Cu), rhodium (Rh), iridium (Ir), platinum (Pt), another suitable metal material, or a combination thereof.

In some embodiments, the dimension (e.g., width) of the contact plugs 136 in the X direction measured at the top surfaces of the contact plugs 136 is in a range from about 5 nm to about 30 nm. In some embodiments, the dimension (e.g., width) of the contact plugs 136 in the X direction measured at the bottom surfaces of the contact plugs 136 is in a range from about 6 nm to about 40 nm. In some embodiments, the thickness (e.g., the dimension in the Z direction) of the contact plugs 136 is in a range from about 10 to about 50 nm.

FIGS. 2D through 2D-2 illustrate a semiconductor structure 100 after the formation of an etching stop layer 138, in accordance with some embodiments. FIGS. 2D-1 and 2D-2 are cross-sectional views corresponding to line X1-X1 and line X2-X2 of FIG. 2D, respectively.

An etching stop layer 138 is formed over the semiconductor structure 100, as shown in FIGS. 2D through 2D-2, in accordance with some embodiments. In some embodiments, the etching stop layer 138. In some embodiments, the etching stop layer 138 is made of dielectric material, such as silicon nitride (SiN), silicon oxynitride (SiON), silicon oxide (SiO$_2$), silicon carbide (SiC), oxygen-doped silicon carbide (SiC:O), oxygen-doped silicon carbonitride (Si(O)CN), or a combination thereof. In some embodiments, a dielectric material for the etching stop layer 138 is deposited using CVD (such as LPCVD, PECVD, HDP-CVD, or HARP), ALD, another suitable method, or a combination thereof.

The etching stop layer 138 is then patterned to have bottom via openings 140 (including 140_1 to 140_4), as shown in FIGS. 2D through 2D-2, in accordance with some embodiments. The bottom via openings 140 correspond to the source contact plugs 136A, in accordance with some embodiments. In some embodiments, the bottom via openings 140 are located outside the area of the active regions 104A and 104B. The patterning process includes forming a photoresist (not shown) such as by using spin-on coating, and then patterned with openings patterns corresponding to the bottom via openings 140_1 to 140_4 by exposing the photoresist to light using an appropriate photomask (or reticle). Exposed or unexposed portions of the photoresist may be removed depending on whether a positive or negative resist is used. The patterns of the photoresist may then be transferred to the etching stop layer 138, such as by using one or more suitable etch processes. The photoresist can be removed in an ashing or wet strip process, for example.

In alternative embodiments, a hard mask layer (not shown) may be formed on semiconductor structure 100. The hard mask layer may include, or be formed of, a nitrogen-free anti-reflection layer (NFARL), carbon-doped silicon dioxide (e.g., SiO$_2$:C), titanium nitride (TiN), titanium oxide (TiO), boron nitride (BN), a multilayer thereof, another suitable material, and/or a combination thereof. The hard mask layer may be etched using a patterned photoresist layer, which may be formed by the photolithography described above, thereby having the opening patterns corresponding to the bottom via openings 140_1 to 140_4. The patterned hard mask layer may transfer the patterns to the etching stop layer 138, which may be accomplished by using one or more suitable etch processes. The etch processes may include dry etching such as a reactive ion etch (RIE), neutral beam etch (NBE), inductive coupled plasma (ICP) etch, another suitable method, or a combination thereof. The etch processes may be anisotropic.

The bottom via opening 140_1 includes a first portion 140M exposing (corresponding to or directly above) the contact plug 136A_1, a second portion 140O exposing (corresponding to or directly above) the contact plug 136A_4, and a connecting portion 140N exposing (corresponding to or directly above) the second interlayer dielectric layer 132 (and contact liners 134), in accordance with some embodiments. The connecting portion 140N is connected to the first portion 140M and the second portion 140O, in accordance with some embodiments. The connecting portion 140N of the bottom via opening 140_1 extends across the final gate stacks 122$_3$ and 122$_4$, in accordance with some embodiments.

In some embodiments, in the Y direction, the first portion 140M has a dimension D1, the connecting portion 140N has a dimension D2, and the second portion 140O has a dimension D3. In some embodiments, dimension D3 is larger than dimension D2 and smaller than dimension D1. In some embodiments, the connecting portion 140N does not overlap the contact plugs 136 and is spaced apart from the contact plug (e.g., 136B_2 and 136_B6) by a distance. In some embodiments, in the X direction, the first portion 140M has a dimension D4, the connecting portion 140N has a dimension D5, and the second portion 140O has a dimension D6. In some embodiments, dimension D4 is substantially equal to dimension D6 and less than dimension D5.

In some embodiments, in the X direction, the edges of the first portion 140M may be substantially aligned with the edges of the overlap area between the contact plug 136A_1 and a subsequently formed metal. In some embodiments, in the X direction, the edges of the second portion 140O may be substantially aligned with the edges of the overlap area between the contact plug 136A_4 and the subsequently formed metal line. As a result, the bottom via opening 140_1 can have a great area, thereby reducing the resistance of the resulting via.

The bottom via opening 140_2 exposes (corresponds to or is directly above) the contact plug 136A_5, in accordance with some embodiments. The bottom via opening 140_3 exposes (corresponds to or is directly above) the contact plug 136A_2, in accordance with some embodiments. In some embodiments, in the X direction, the edges of the bottom via opening 140_2 may be substantially aligned with the edges of the overlap area between the contact plug 136A_5 and a subsequently formed metal. In some embodiments, in the X direction, the edges of the bottom via opening 140_3 may be substantially aligned with the edges of the overlap area between the contact plug 136A_2 and the subsequently formed metal line, respectively. As a result, the bottom via openings 140_2 and 140_3 can have great areas, thereby reducing the resistance of the resulting vias, e.g., contact resistance (Rc).

The bottom via opening 140_4 includes a first portion 140P exposing (corresponding to or directly above) the contact plug 136A_6, a second portion 140R exposing (corresponding to or directly above) the contact plug 136A_3, and a connecting portion 140Q exposing (corresponding to or directly above) the second interlayer dielectric layer 132 (and contact liners 134), in accordance with some embodiments. The connecting portion 140Q is connected to the first portion 140P and the second portion 140R, in accordance with some embodiments. The connecting portion 140Q of the bottom via opening 140_4 extends across the final gate stack 122₄, in accordance with some embodiments.

In some embodiments, in the Y direction, the first portion 140P has a dimension D7, the connecting portion 140Q also has dimension D7, and the second portion 140R has a dimension D8. In some embodiments, dimension D8 is larger than dimension D7. In some embodiments, in the X direction, the first portion 140P has a dimension D9, the connecting portion 140N has a dimension D10, and the second portion 140R has a dimension D11. In some embodiments, dimension D9 is substantially equal to dimension D11 and less than dimension D10. In alternative embodiments, dimension D10 is equal to or less than the dimensions D9 and D11.

In some embodiments, in the X direction, the edges of the first portion 140P may be substantially aligned with the edges of the overlap area between the contact plug 136A_6 and a subsequently formed metal line. In some embodiments, in the X direction, the edges of the second portion 140R may be substantially aligned with the edges of the overlap area between the contact plug 136A_3 and the subsequently formed metal line. As a result, the bottom via opening 140_4 can have a great area, thereby reducing the resistance of the resulting via, e.g., contact resistance (Rc).

In some embodiments, the bottom via openings 140 have sloped and linear sidewalls, as shown in FIG. 2D-1. In some embodiments, the widths of the bottom via openings 140 are tapered downwardly. In some embodiments, an angle A1 between the sidewall and the bottom surface of the bottom via opening 140 (e.g., 140_4) is larger than 90 degrees, e.g., in a range from about 91 degrees to about 110 degrees.

FIGS. 2E-1 and 2E-2 illustrate a semiconductor structure 100 after the deposition of a barrier liner 142 and a metal bulk layer 144, in accordance with some embodiments. FIGS. 2E-1 and 2E-2 are cross-sectional views corresponding to line X1-X1 and line X2-X2 of FIG. 2D, respectively.

A barrier liner 142 is deposited over the semiconductor structure 100 to partially fill the bottom via openings 140, as shown in FIGS. 2E-1 and 2E-2, in accordance with some embodiments. In some embodiments, the barrier liner 142 conformally extends along, and covers, the top surface of the etching stop layer 138 and the sidewalls (e.g., defined by the exposed surfaces of the etching stop layer 138) and the bottom surfaces (e.g., defined by the exposed surfaces of the contact liners 134, the contact plugs 136A and the second interlayer dielectric layer 132) of the bottom via openings 140. The barrier liner 142 partially fills the bottom via openings 140, in accordance with some embodiments.

In some embodiments, the barrier liner 142 is made of conductive material such as Ti, TiN, W, Ta, TaN, CoW, WN, $WO_x$ (here 0<x<1), $AlO_x$ (here 0<x<1), another metal oxidation, another metal nitridation, another metal compound, another suitable material, or a combination thereof. In some embodiments, the barrier liner 142 is deposited using ALD, CVD, PVD, ECP, ELD, another suitable method, or a combination thereof. In some embodiments, the barrier liner 142 has a thickness T1 in a range from about 0.5 nm to about 30 nm.

A metal bulk layer 144 is deposited over the barrier liner 142 and overfills the remainder of the bottom via openings 140, as shown in FIGS. 2E-1 and 2E-2, in accordance with some embodiments. In some embodiments, the metal bulk layer 144 is made of one or more conductive materials, for example, Co, W, Ru, Mo, Al, Ni, Ti, Ta, Cu, Rh, Ir, Pt, another suitable metal material, or a combination thereof. In some embodiments, the metal bulk layer 144 is deposited using CVD (such as LPCVD or PECVD), PVD, ALD, ECP, ELD, another suitable method, or a combination thereof. In some embodiments, the metal bulk layer 144 is formed by CVD in a conformal deposition manner, and the material of the metal bulk layer 144 growing from the opposite sidewalls of the bottom via openings 140 merge, thereby forming a seam (shown in FIG. 2J-3) within the metal bulk layer 144.

FIGS. 2F through 2F-2 illustrate a semiconductor structure 100 after a planarization process, in accordance with some embodiments. FIGS. 2F-1 and 2F-2 are cross-sectional views corresponding to line X1-X1 and line X2-X2 of FIG. 2F, respectively.

A planarization process is performed on the barrier liner 142 and the metal bulk layer 144 to remove the portions of the barrier liner 142 and the metal bulk layer 144 over the top surface of the etching stop layer 138, as shown in FIGS. 2F through 2F-2, in accordance with some embodiments. The planarization is performed until the top surface of the etching stop layer 138 is exposed, in accordance with some embodiments. In some embodiments, the planarization process is CMP or etching back process. After the planarization process, the top surfaces of the barrier liner 142, the metal bulk layer 144 and the etching stop layer 138 are substantially coplanar.

The remainders of the barrier liner 142 and the metal bulk layer 144 in the bottom via openings 140 serve as bottom via portions 146 (including 146_1 to 146_4), in accordance with some embodiments. The metal bulk layer 144 of the bottom via portion 146 is nested within the barrier liner 142 of the bottom via portion 146, in accordance with some embodiments. In some embodiments, the bottom via portions 146 are configured to provide metal surfaces for a following deposition process. This will be discussed in detail later.

FIGS. 2G through 2G-2 illustrate a semiconductor structure 100 after the formation of a third interlayer dielectric layer 148, in accordance with some embodiments. FIGS.

2G-1 and 2G-2 are cross-sectional views corresponding to line X1-X1 and line X2-X2 of FIG. 2G, respectively.

A third interlayer dielectric layer 148 is formed over the semiconductor structure 100, as shown in FIGS. 2G-1 and 2G-2, in accordance with some embodiments. In some embodiments, the third interlayer dielectric layer 148 is made of dielectric material, such as USG, BPSG, FSG, PSG, BSG, or another suitable dielectric material. In some embodiments, the third interlayer dielectric layer 148 and etching stop layer 138 are made of different materials and have a great difference in etching selectivity. In some embodiments, the third interlayer dielectric layer 148 is deposited using such as CVD (such as HDP-CVD, PECVD, HARP or FCVD), another suitable technique, or a combination thereof.

The third interlayer dielectric layer 148 is then patterned to have top via openings 150 (including 150_1 to 150_4), as shown in FIGS. 2G through 2G-2, in accordance with some embodiments. The top via openings 150_1 to 150_4 correspond to the bottom via portions 146_1 to 146_4, respectively, in accordance with some embodiments. The top via openings 150_1 to 150_4 are aligned over and expose the bottom via portions 146_1 to 146_4, respectively, in accordance with some embodiments.

The patterning process includes forming a photoresist (not shown) such as by using spin-on coating, and then patterned with openings patterns corresponding to the top via openings 150_1 to 150_4 by exposing the photoresist to light using an appropriate photomask (or reticle). Exposed or unexposed portions of the photoresist may be removed depending on whether a positive or negative resist is used. The patterns of the photoresist may then be transferred to the third interlayer dielectric layer 148, such as by using one or more suitable etch processes. The photoresist can be removed in an ashing or wet strip process, for example. In some embodiments, the same photomask (or reticle) is used in the photolithography process used to form the top via openings 150_1 to 150_4 and the photolithography process used to form the bottom via openings 140_1 to 140_4. As a result, the top via openings 150_1 to 150_4 have substantially the same or similar dimensions and locations as the bottom via openings 140_1 to 140_4.

In alternative embodiments, a hard mask layer (not shown) may be formed on semiconductor structure 100. The hard mask layer may include, or be formed of, NFARL, carbon-doped silicon dioxide (e.g., $SiO_2$:C), TiN, TiO, BN, a multilayer thereof, another suitable material, and/or a combination thereof. The hard mask layer may be etched using a patterned photoresist layer, which may be formed by the photolithography process described above, thereby having the opening patterns corresponding to the top via openings 150_1 to 150_4. The patterned hard mask layer may transfer the patterns to the third interlayer dielectric layer 148, which may be accomplished by using one or more suitable etch processes. The etch processes may include dry etching such as a RIE, NBE, ICP etch, another suitable method, or a combination thereof. The etch processes may be anisotropic.

In some embodiments, the top via openings 150 have sloped and linear sidewalls. In some embodiments, the widths of the top via openings 150 are tapered downwardly. In some embodiments, an angle A2 between the sidewall and the bottom surface of the top via opening 150 (e.g., 150_4) is greater than about 90 degrees, e.g., in a range from about 91 degrees to about 110 degrees. In some embodiments, the slope of the sidewalls of the top via openings 150 is different than the slope of the sidewalls of the bottom via openings

140. For example, the sidewalls of the top via openings 150 is steeper than the sidewalls of the bottom via openings 140. In some embodiments, the angle A2 is different than the angle A1. For example, the angle A2 is greater than the angle A1. In some embodiments, the sidewall of the top via opening 150 and the sidewall of the bottom via portion 146 are connected to each other, and an angle between the sidewall of the top via opening 150 and the sidewall of the bottom via portion 146 is less than 180 degrees.

Afterwards, the third interlayer dielectric layer 148 is patterned to have via openings 152 (including 152_1 to 152_4), as shown in FIGS. 2G through 2G-2, in accordance with some embodiments. The via openings 152 correspond to the drain contact plugs 136B, in accordance with some embodiments. In some embodiments, the via openings 152 are located within the area of the active regions 104A and 104B. The patterning process includes forming a photoresist (not shown) such as by using spin-on coating, and then patterned with openings patterns corresponding to the via openings 152_1 to 152_4 by exposing the photoresist to light using an appropriate photomask (or reticle). Exposed or unexposed portions of the photoresist may be removed depending on whether a positive or negative resist is used. The patterns of the photoresist may then be transferred to the third interlayer dielectric layer 148, such as by using one or more suitable etch processes. The photoresist can be removed in an ashing or wet strip process, for example.

In alternative embodiments, a hard mask layer (not shown) may be formed on semiconductor structure 100. The hard mask layer may include, or be formed of, NFARL, carbon-doped silicon dioxide (e.g., $SiO_2$:C), TiN, TiO, BN, a multilayer thereof, another suitable material, and/or a combination thereof. The hard mask layer may be etched using a patterned photoresist layer, which may be formed by the photolithography described above, thereby having the opening patterns corresponding to the via openings 152_1 to 152_4. The patterned hard mask layer may transfer the patterns to the third interlayer dielectric layer 148, which may be accomplished by using one or more suitable etch processes. The etch processes may include dry etching such as a RIE, NBE, ICP etch, another suitable method, or a combination thereof. The etch processes may be anisotropic.

The via openings 152_1 exposes (corresponds to or is directly above) the contact plug 136B_1, in accordance with some embodiments. The via openings 152_2 exposes (corresponds to or is directly above) the contact plug 136B_2, in accordance with some embodiments. The via openings 152_3 exposes (corresponds to or is directly above) the contact plug 136B_3, in accordance with some embodiments. The via openings 152_4 exposes (corresponds to or is directly above) the contact plug 136B_4, in accordance with some embodiments.

In some embodiments, the via openings 152 are deeper than the top via openings 150. In some embodiments, the via openings 152 have sloped and linear sidewalls. In some embodiments, the widths of the via openings 152 are tapered downwardly. In some embodiments, the upper portion of the sidewalls of the via openings 152 (e.g., defined by the exposed sidewalls of the third interlayer dielectric layer 148) and the lower portion of the sidewalls of the via openings 152 (e.g., defined by the exposed sidewalls of the etching stop layer 138) have the same slope and are colinear.

FIGS. 2H-1 and 2H-2 illustrate a semiconductor structure 100 after the deposition of a metal bulk layer 154, in accordance with some embodiments. FIGS. 2H-1 and 2H-2 correspond to line X1-X1 and line X2-X2 of FIG. 2G, respectively.

A metal bulk layer 154 is deposited over the semiconductor structure 100 to overfill the top via openings 150 and the via openings 152, as shown in FIGS. 2H-1 and 2H-2, in accordance with some embodiments. In some embodiments, the metal bulk layer 154 is made of one or more conductive materials, for example Co, W, Ru, Mo, Al, Ni, Ti, Ta, Cu, Rh, Ir, Pt, another suitable metal material, or a combination thereof. The metal bulk layer 154 is formed using a bottom-up deposition process, in accordance with some embodiments. The bottom-up deposition process generally refers to a deposition process that fills an opening from bottom to top (which can be referred to as bottom-up fill of the opening). In some embodiments, the bottom-up deposition process has better gap-fill capability and may facilitate the formation of void- or seam-free via and prevent peeling of the metal bulk layer 154 during following CMP or etching back process. Therefore, a barrier liner may be not formed in the top via openings 150 and the via openings 152 before depositing the metal bulk layer 154. As a result, the vias may have a larger volumetric proportion of the low-resistance metal bulk layer, which may reduce the resistance of the resulting vias, e.g., contact resistance (Rc).

In some embodiments, the bottom-up deposition process is a selective deposition process. In some embodiments, the bottom-up deposition process includes configuring the various parameters of the deposition process to selectively grow the metal bulk layer 154 from metal surfaces (here, the top surfaces of the bottom via portions 146 and the top surfaces of the contact plugs 136B) while limiting (or preventing) growth of the metal bulk layer 154 from dielectric surfaces (here, the top surface and exposed sidewalls of the third interlayer dielectric layer 148 and the exposed sidewalls of the etching stop layer 138).

For example, depositing the metal bulk layer 154 includes performing an ALD-cyclic process, where a number of ALD cycles is tuned to control the desired thickness of the metal bulk layer 154, e.g., the metal bulk layer 154 grows to protrude above the top surface of the third interlayer dielectric layer 148. When the deposition is completed, the top of the metal bulk layer 154 growing from the bottom via portions 146 may be higher than the top of the metal bulk layer 154 growing from the contact plugs 136B, in accordance with some embodiments. In a case without forming the bottom via portions 146, due to the characteristics of the bottom-up deposition process, the metal bulk layer may be difficult to deposit on the dielectric surface provided by the second interlayer dielectric layer 132. As a result, the metal bulk layers growing from the contact plugs merge with each other and seal a void above the dielectric surface, which may decrease the volumetric proportion of the metal bulk layer in the resulting via. Therefore, the formation of the bottom via portions 146 may facilitate the formation of void-free metal bulk layer 154 in the top via openings 150.

In some other embodiments, the deposition process is PVD, CVD, ALD, electroplating, electroless plating, other suitable deposition process, or combinations thereof. For example, a barrier liner (such as Ti, TiN, W, Ta, TaN, CoW, WN, $WO_x$ (here 0<x<1), $AlO_x$ (here 0<x<1), another metal oxidation, another metal nitridation, another metal compound, another suitable material, or a combination thereof) may be formed in the top via openings 150 and the via openings 152 before depositing the metal bulk layer 154.

FIGS. 2I through 2I-2 illustrate a semiconductor structure 100 after a planarization process, in accordance with some embodiments. FIGS. 2I-1 and 2I-2 are cross-sectional views corresponding to line X1-X1 and line X2-X2 of FIG. 2I, respectively.

A planarization process is performed on the metal bulk layer 154 to remove the portions of the metal bulk layer 154 above the top surface of the third interlayer dielectric layer 148, as shown in FIGS. 2G through 2G-2, in accordance with some embodiments. In some embodiments, the planarization process is an etching back process or CMP. After the planarization process, the top surfaces of the metal bulk layer 154 and the third interlayer dielectric layer 148 are substantially coplanar. The metal bulk layer 154 in the top via openings 150 serves as top via portions, which combine with the underlying bottom via portions 146 to form vias 156A (including 156A_1 to 156A_4), in accordance with some embodiments. In some embodiments, the bottom via portions 146 of the vias 156A have a thickness T2 in a range from about 1 nm to about 50 nm. In some embodiments, the top via portions 154 of the vias 156A have a thickness T3 in a range from about 1 nm to about 50 nm. The metal bulk layer 154 in the via openings 152 serves as vias 156B (including 156B_1 to 156B_4), in accordance with some embodiments. In some embodiments, the vias 156B have a thickness T4 in a range from about 2 nm to about 50 nm. In some embodiments, the thickness T3 is less than the thickness T4.

The vias 156A correspond to and land on the source contact plugs 136A and may be referred to as source vias, in accordance with some embodiments. In some embodiments, the vias 156A are located outside the area of the active regions 104A and 104B. The via 156A_1 includes a first landing portion 156M directly above the contact plug 136A_1, a second landing portion 156O directly above the contact plug 136A_4, and a connecting portion 156N directly above the second interlayer dielectric layer 132 (and the contact liners 134) and connected to the first landing portion 156M and the second landing portion 156O, in accordance with some embodiments. The connecting portion 156N of the via 156A_1 extends across the final gate stacks 122₃ and 122₄, in accordance with some embodiments.

In some embodiments, in the Y direction, the first landing portion 156M also has dimension D1, the connecting portion 156N also has dimension D2, and the second landing portion 156N also has dimension D3. In some embodiments, dimension D3 is larger than dimension D2 and smaller than dimension D1. In some embodiments, the connecting portion 156N does not overlap the contact plugs 136 and is spaced apart from the contact plug (e.g., 136B_2 and 136_B6) by a distance. In some embodiments, in the X direction, the first landing portion 156M also has dimension D4, the connecting portion 156N also has dimension D5, and the second landing portion 156O also has dimension D6. In some embodiments, dimension D4 is substantially equal to dimension D6 and less than dimension D5.

The via 156A_2 is located directly above the contact plug 136A_5, in accordance with some embodiments. The via 156A_3 is located directly above the contact plug 136A_2, in accordance with some embodiments.

The via 156A_4 includes a first landing portion 156P directly above the contact plug 136A_6, a second landing portion 156R directly above the contact plug 136A_3, and a connecting portion 156Q directly above the second interlayer dielectric layer 132 (and the contact liners 134) and connected to the first landing portion 156P and the second landing portion 156R, in accordance with some embodiments. The connecting portion 156Q of the via 156A_4 extends across the final gate stack 122₄, in accordance with some embodiments.

In some embodiments, in the Y direction, the first landing portion 156P has a dimension D7, the connecting portion 156Q also has dimension D7, the second landing portion 156R has a dimension D8, and dimension D8 is larger than dimension D7. In some embodiments, in the X direction, the first landing portion 156P has a dimension D9, the connecting portion 156N has a dimension D10, the second portion 156R has a dimension D11, and dimension D9 is substantially equal to dimension D11 and less than dimension D10. In alternative embodiments, dimension D10 is less than the dimensions D9 and D11.

The vias 156B correspond to and land on the drain contact plugs 136B and may be referred to as drain vias, in accordance with some embodiments. In some embodiments, the vias 156B are located within the area of the active regions 104A and 104B. The via 156B_1 is located directly above the contact plug 136B_1, in accordance with some embodiments. The via 156B_2 is located directly above the contact plug 136B_2, in accordance with some embodiments. The via 156B_3 is located directly above the contact plug 136B_3, in accordance with some embodiments. The via 156B_4 is located directly above the contact plug 136B_4, in accordance with some embodiments.

Although the vias 156A (e.g., 156A_6) includes two landing portions (e.g., 156M and 156O) and extends across two final gate stacks 122 (e.g., $122_3$ and $122_4$), the vias 156A may include more two landing portions and extends across more than two final gate stacks 122. In some embodiments, the dimension of the vias 156A in the X direction is in a range from about 5 nm to about 20 μm. In some embodiments, the dimension of the vias 156A in the Y direction is in a range from about 4 nm to about 100 nm. In some embodiments, a distance D12 between the top surface of the final gate stack 122 and the top surface of the contact plug 136B (or 136A) is less than 30 nm. In some embodiments, the sidewall of the top via portion 154 and the sidewall of the bottom via portion 146 are connected to each other, and an angle between the sidewall of the top via portion 154 and the sidewall of the bottom via portion 146 is less than 180 degrees.

FIGS. 2J through 2J-2 illustrate a semiconductor structure 100 after the formation of vias 158 and a first metal layer (M1), in accordance with some embodiments. FIGS. 2J-1, 2J-2 and 2J-3 are cross-sectional views corresponding to line X1-X1, line X2-X2 and line Y-Y of FIG. 2J, respectively.

Vias 158 are formed in and/or through the third interlayer dielectric layer 148, the etching stop layer 138, the second interlayer dielectric layer 132 and the etching stop layer 130 and land on the final gate stacks 122 (e.g., 1222 and $122_4$), as shown in FIG. 2J, in accordance with some embodiments. The vias 158 are electrically connected to the metal gate electrode layer 128 of the final gate stacks 122 and may be also referred to as gate vias (VG), in accordance with some embodiments.

An intermetal dielectric (IMD) layer 160 is formed over the vias 156A, 156B and 158 and the third interlayer dielectric layer 148, as shown in FIG. 2J-3, in accordance with some embodiments. In some embodiments, the intermetal dielectric layer 160 is made of one or more dielectric materials, such as silicon oxide (SiO), silicon nitride (SiN), silicon oxynitride (SiON), silicon carbide (SiC), aluminum oxide ($Al_2O_3$), dielectric material(s) with low dielectric constant (low-k) such as SiCOH, SiOCN, and/or SiOC, or a combination thereof. In some embodiments, the intermetal dielectric layer 160 is made of an extreme low-k (ELK) dielectric material with a dielectric constant (k) less than about 3.0, or even less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the intermetal dielectric layer 160 is formed using CVD (such as LPCVD, HARP, and FCVD), ALD, spin-on coating, another suitable method, or a combination thereof. A post-curing process (e.g., UV curing) may be performed on the as-deposited ELK dielectric material for the intermetal dielectric layer 160 to form a porous structure.

A first metal layer (M1) is formed in and/or through the intermetal dielectric layer 160, in accordance with some embodiments. The first metal layer (M1) includes several conductive lines (or tracks), e.g., power supply lines 162A and signal lines 162B, as shown in FIGS. 2J through 2J-3, in accordance with some embodiments. The lines 162A and 162B extend in the X direction. That is, the lines 162A and 162B have longitudinal axes parallel to the X direction, in accordance with some embodiments. The power supply lines 162A may include a Vdd power rail providing positive voltage and/or a Vss power rail which may be an electrical ground, in accordance with some embodiments. The Vss power rail is electrically connected to the source terminals of the n-channel transistors through the vias 156A and the contact plugs 136A, in accordance with some embodiments. The Vdd power rail is electrically connected to the source terminals of the p-channel transistors through the vias 156A and the contact plugs 136A, in accordance with some embodiments. The signal lines 162B are electrically connected to the drain terminals of the n-channel transistors and/or p-channel transistors through the vias 156B and the contact plugs 136B and to the gate terminals of the n-channel transistors and/or p-channel transistors through the vias 158, in accordance with some embodiments.

In some embodiments, in the X direction, the edges of the first landing portion 156M of the via 156A_1 may be substantially aligned with the edges of the overlap area between the contact plug 136A_1 and the metal line 162A. In some embodiments, in the X direction, the edges of the second landing portion 156O of the via 156A_1 may be substantially aligned with the edges of the overlap area between the contact plug 136A_4 and the metal line 162A. In some embodiments, in the X direction, the edges of the via 156A_2 may be substantially aligned with the edges of the overlap area between the contact plug 136A_5 and the metal line 162A. In some embodiments, in the X direction, the edges of via 156A_3 may be substantially aligned with the edges of the overlap area between the contact plug 136A_2 and the metal line 162A. In some embodiments, in the X direction, the edges of the first landing portion 156P of the via 156A_4 may be substantially aligned with the edges of the overlap area between the contact plug 136A_6 and the metal line 162A. In some embodiments, in the X direction, the edges of the second landing portion 156R of the via 156A_4 may be substantially aligned with the edges of the overlap area between the contact plug 136A_3 the metal line 162A.

As a result, the vias 156A can have great areas, thereby reducing the resistance of the vias 156A, e.g., contact resistance (Rc). Furthermore, as compared with vias only having landing portions, the vias 156A_1 and 156A_4 have the connecting portion 156N and 156Q, thus may further reduce their resistance.

In some embodiments, the formation of the first metal layer (M1) includes patterning the intermetal dielectric layer 160 using photolithography and etching processes to form trenches (where the first metal layer (M1) is to be formed) through the intermetal dielectric layer 160 and exposing the vias 156A, 156B and 158. The etch processes may include dry etching such as RIE, NBE, ICP etch, CCP etch, another suitable method, or a combination thereof. One or more conductive materials for the first metal layer (M1) are then deposited using CVD, PVD, e-beam evaporation, ALD, ECP, ELD, another suitable method to overfill the trenches. Afterward, a planarization process such as CMP and/or an etching back process is performed to remove an excess portion of the conductive materials from the upper surface of the intermetal dielectric layer 160. After the planarization process, the upper surfaces of the first metal layer (M1) and the intermetal dielectric layer 160 are substantially coplanar, in accordance with some embodiments.

The first metal layer M1 may have a multilayer structure. For example, a barrier liner (not shown) may optionally be deposited along the sidewalls and the bottom surfaces of the trenches. The barrier liner may be made of conductive material such as Ti, TiN, W, Ta, TaN, CoW, WN, $WO_x$ (here $0<x<1$), $AlO_x$ (here $0<x<1$), another metal oxidation, another metal nitridation, another metal compound, another suitable material, or a combination thereof. In some embodiments, the metal bulk layer is formed on the barrier liner (if formed) to overfill the trenches. In some embodiments, the metal bulk layer is formed using a selective deposition technique in a bottom-up manner such as cyclic CVD process, cyclic ALD, or ELD process, and it is not necessary to form a barrier liner in the trenches before depositing the metal bulk material. In some embodiments, the metal bulk layer is made of one or more conductive materials with low resistance and good gap-fill ability, for example, Co, W, Ru, Mo, Al, Ni, Ti, Ta, Cu, Rh, Ir, Pt, another suitable metal material, or a combination thereof.

In some embodiments, a seam 164 is formed within the metal bulk layer 144, as shown in FIG. 2J-3. In some embodiments, the seam 164 terminates at the interface between the metal bulk layer 144 and the metal bulk layer 154.

Additional components (such as second and third layers (M2 and M3)) may be formed over the semiconductor structure 100 to electrically couple the circuits in different cell regions to produce an integrated circuit.

FIG. 3 is a cross-sectional view of a source vias 156A of FIG. 2J-1, in accordance with some embodiments of the disclosure. In some embodiments where the barrier liner 142, the metal bulk layer 144 and the metal bulk layer 154 are made of tungsten, the barrier liner 142, the metal bulk layer 144 and the metal bulk layer 154 may have different grain size because they are formed by different deposition processes. For example, the barrier liner 142 has grains G1 with a first average grain size, the metal bulk layer 144 has grains G2 with a second average grain size that is greater than the first average grain sizes, in accordance with some embodiments. The metal bulk layer 154 has grains G3 with a third average grain size that is greater than the second grain size, in accordance with some embodiments. In some embodiments, due to the effect of the grain boundary area on the conductivity of metal material, the electric conductivity of the barrier liner 142 may be lower than the electric conductivity of the metal bulk layer 144, and the electric conductivity of the metal bulk layer may be lower than the electric conductivity of the metal bulk layer 154.

Although the embodiments described above are used in the semiconductor structure with FinFET design, the concept of the embodiments may be also used in a semiconductor device structure with another applicable design, e.g., planar FETs, dual-gate FETs, tri-gate FETGAA FETs (e.g., nanostructure FET (such as gate-all-around (GAA) FETs), forksheet FETs, ribbon FETs, multi-bridge channel (MBC) FETs, etc.).

Figure 4:
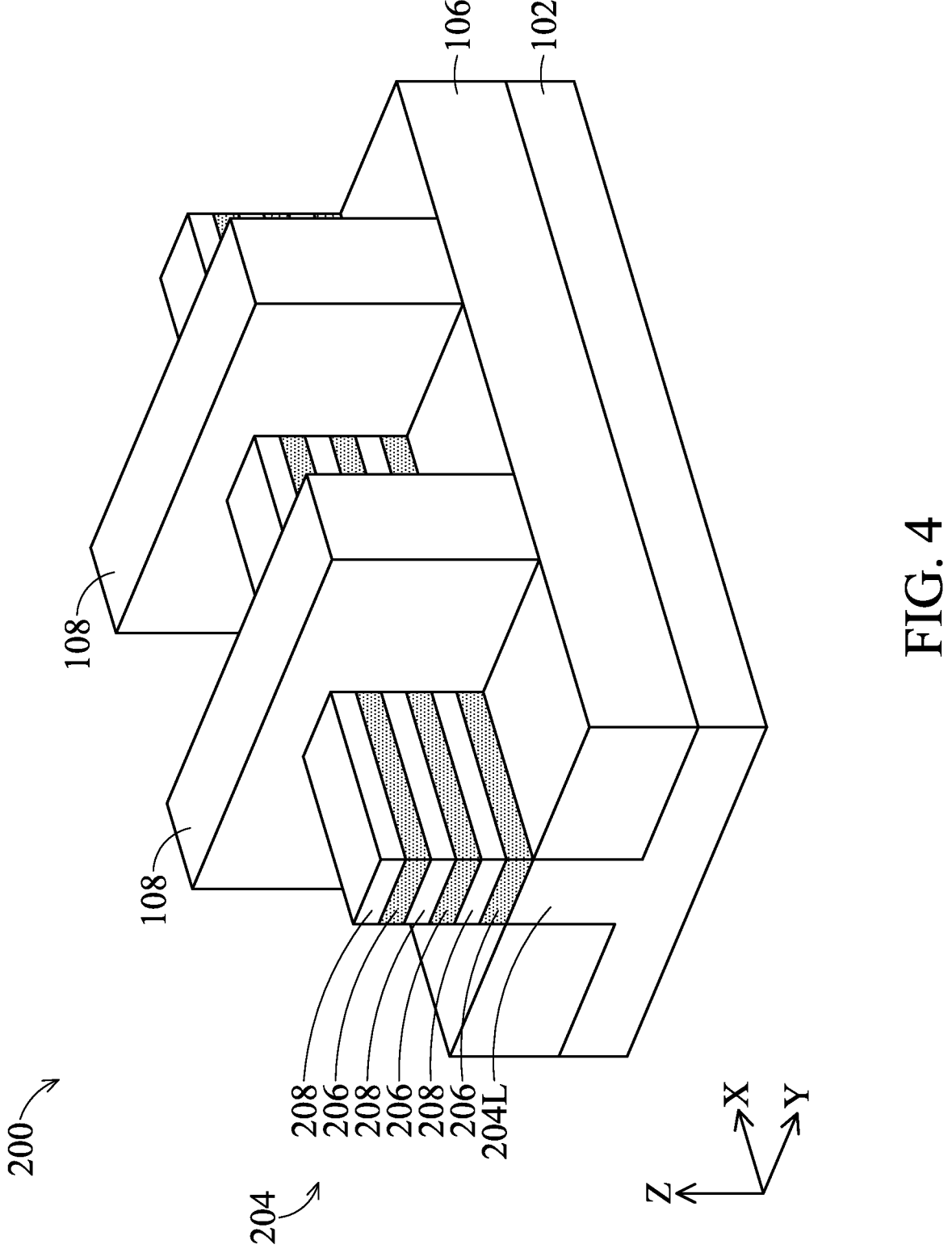
FIG. 4 is a perspective view of a semiconductor structure, in accordance with some embodiments of the disclosure.

FIG. 4 is a perspective view of a semiconductor structure 200 with GAA design, in accordance with some embodiments of the disclosure.

The GAA transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The semiconductor structure 200 includes a substrate 102 and a fin structure 204 over the substrate 102, as shown in FIG. 4, in accordance with some embodiments. The fin structure 204 is the active region of the semiconductor structure 200, in accordance with some embodiments. The fin structure 204 includes a lower fin element 204L formed from the substrate 102, in accordance with some embodiments. The lower fin element 204L is surrounded by an isolation structure 106, in accordance with some embodiments. The fin structure 204 further includes an upper fin element formed from an epitaxial stack including alternating first semiconductor layers 206 and second semiconductor layers 208, in accordance with some embodiments. The second semiconductor layers 208 will form nanostructures (e.g., nanowires or nanosheets) and serve as the channel for the resulting semiconductor devices, in accordance with some embodiments.

The fin structure 204 extends in the X direction, in accordance with some embodiments. The fin structure 204 is defined as several channel regions and several source/drain regions, where the channel regions and the source/drain regions are alternately arranged, in accordance with some embodiments. Gate structures 108 are formed with longitudinal axes parallel to the Y direction and extending across and/or surrounding the channel regions of the fin structure 204, in accordance with some embodiments. The source/drain regions of the fin structure 204 are exposed from the gate structures 112, in accordance with some embodiments.

Figure 5A:
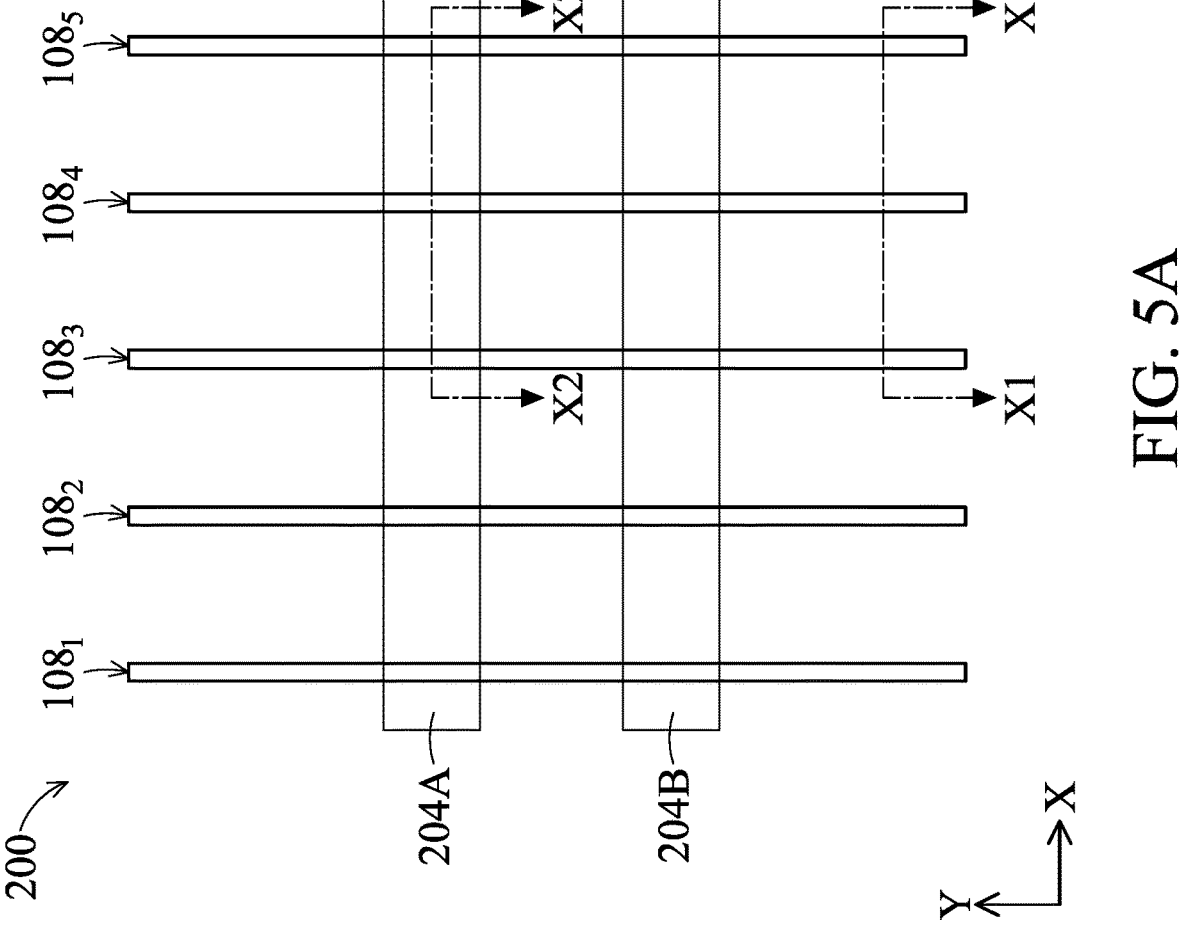
FIGS. 5A, 5B and 5C are plan views illustrating the formation of a semiconductor structure at various intermediate stages, in accordance with some embodiments of the disclosure.
Figures 1, 5A:
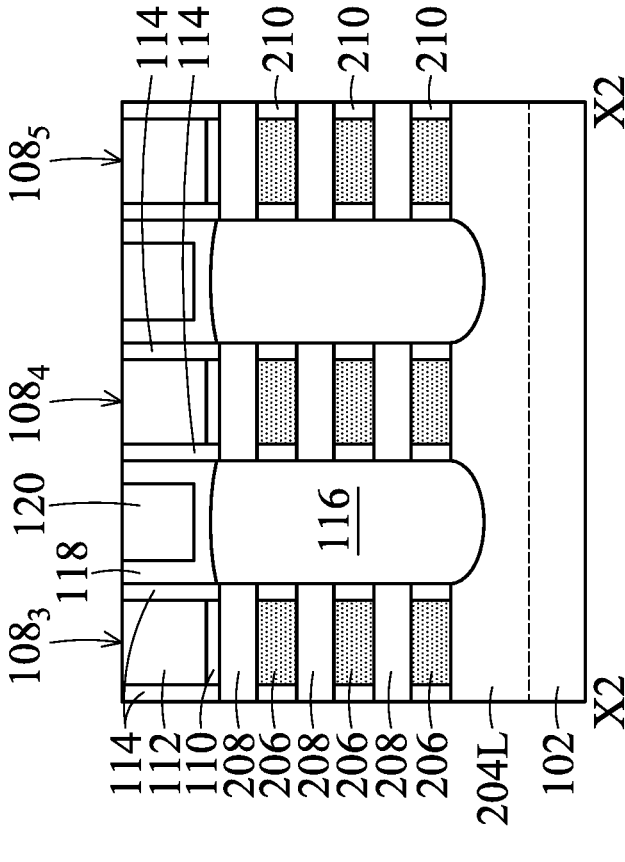
Figures 2, 5A:
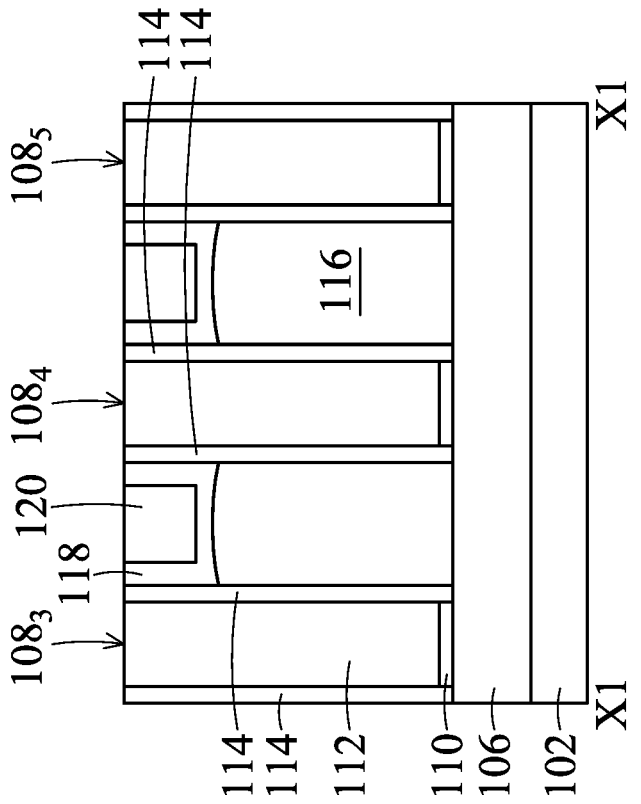
Figure 5B:
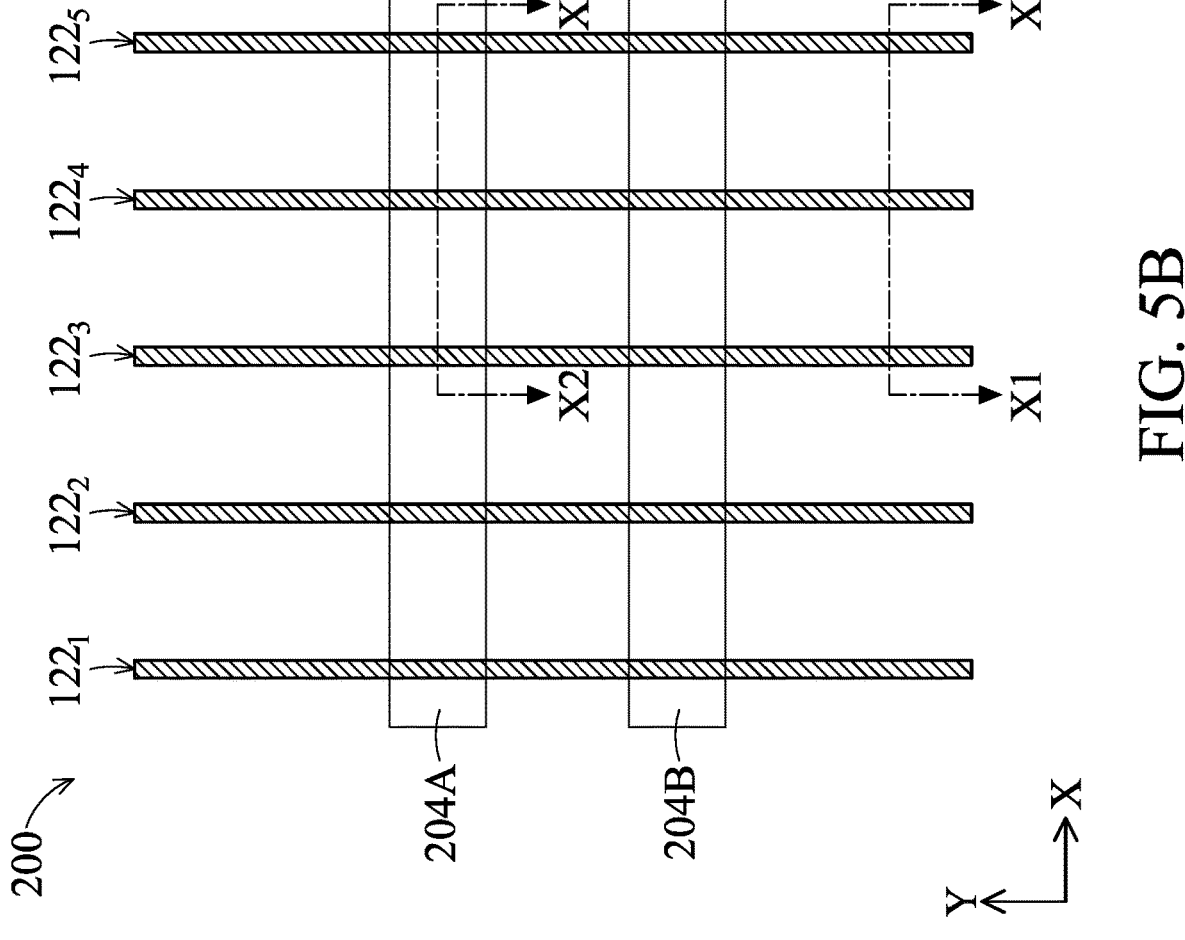
Figures 2, 5B:
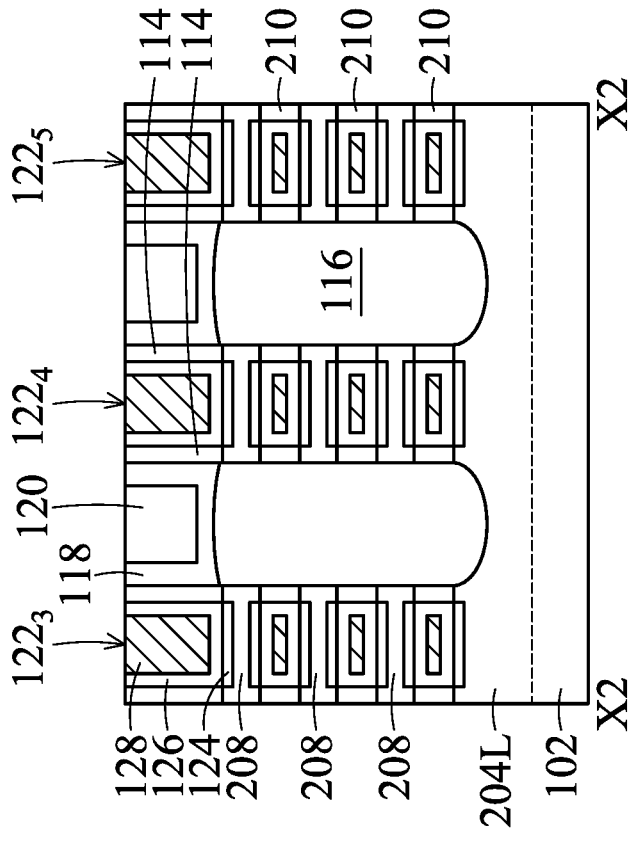
Figures 1, 5B:
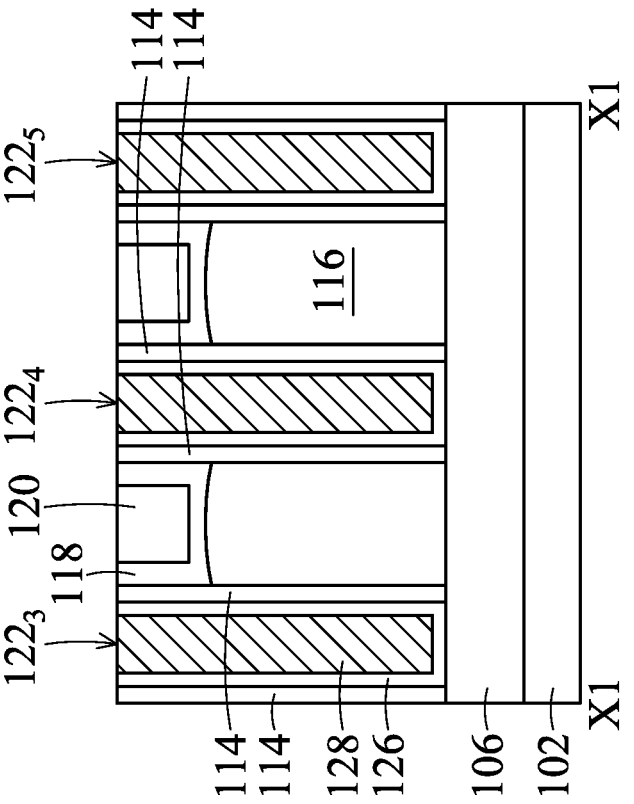
Figure 5C:
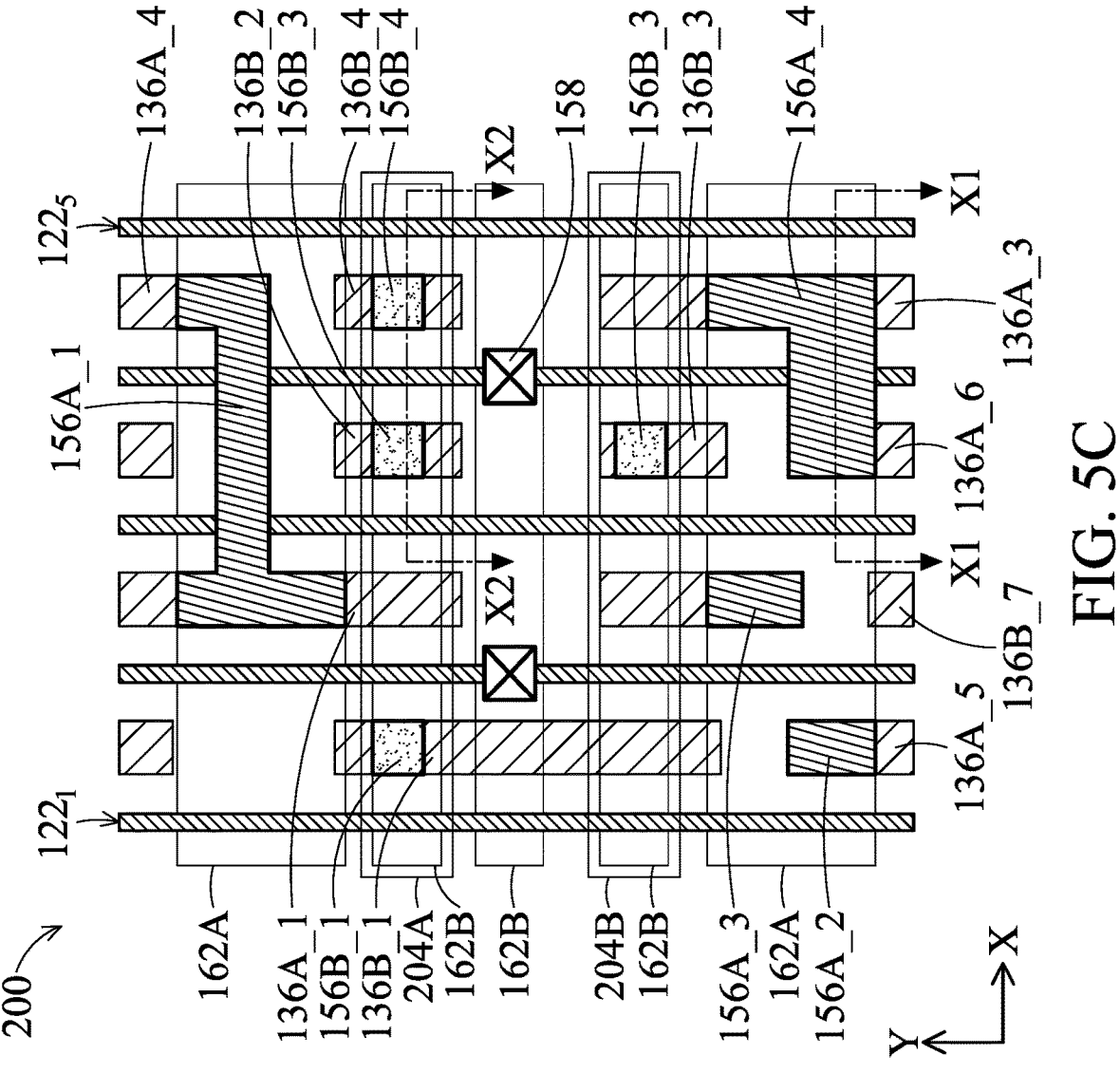
Figures 1, 2, 5C:
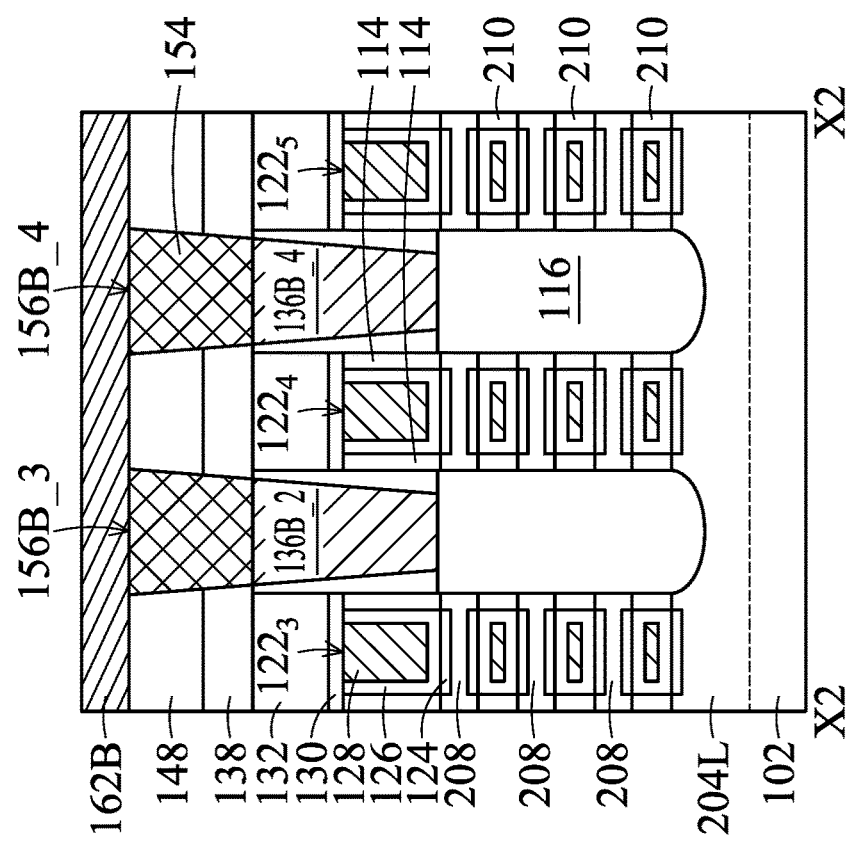

FIGS. 5A, 5B and 5C are plan views illustrating the formation of a semiconductor structure 200 at various intermediate stages, in accordance with some embodiments of the disclosure.

FIGS. 5A through 5A-2 illustrate a semiconductor structure 200 after the formation of active regions 204, an isolation structure 106, dummy gate structures 108, gate spacer layers 114, inner spacer layers 210, source/drain features 116, contact etching stop layer 118, and a first interlayer dielectric layer 120, in accordance with some embodiments. FIGS. 5A-1 and 5A-2 are cross-sectional views of the semiconductor structure 200 taken along line X1-X1 and line X2-X2 of FIG. 5A, respectively.

The semiconductor structure 200 includes a substrate 102, active regions 204 (including 204A and 204B) and an isolation structure 106 over the substrate 102, and dummy gate structures 108 (including $108_{1-5}$) over the active regions 204 and the isolation structure 106, as shown in FIGS. 5A through 5A-2, in accordance with some embodiments. The formation of the active regions 204 includes forming an epitaxial stack over the substrate 102 using an epitaxial growth process, in accordance with some embodiments. The epitaxial stack includes alternating first semiconductor layers 206 and second semiconductor layers 208, in accordance with some embodiments. The epitaxial growth process may be MBE, MOCVD, or VPE, or another suitable technique.

In some embodiments, the first semiconductor layers 206 are made of a first semiconductor material and the second semiconductor layers 208 are made of a second semiconductor material. The first semiconductor material for the first semiconductor layers 206 has a different lattice constant than the second semiconductor material for the second semiconductor layers 208, in accordance with some embodiments. In some embodiments, the first semiconductor material and the second semiconductor material have different oxidation rates and/or etching selectivity. In some embodiments, the first semiconductor layers 206 are made of SiGe, where the percentage of germanium (Ge) in the SiGe is in a range from about 20 atomic % to about 50 atomic %, and the second semiconductor layers 208 are made of pure or substantially pure silicon. In some embodiments, the first semiconductor layers 206 are $Si_{1-x}Ge_x$, where x is more than about 0.3, or Ge (x=1.0) and the second semiconductor layers 208 are Si or $Si_{1-y}Ge_y$, where y is less than about 0.4, and x>y.

The first semiconductor layers 206 are configured as sacrificial layers and will be removed to form gaps to accommodate gate materials, and the second semiconductor layers 208 will form nanostructures (e.g., nanowires or nanosheets) that laterally extend between source/drain features and serve as the channel layers for the resulting semiconductor devices (such as nanostructure transistors), in accordance with some embodiments.

The formation of the active regions 204A and 204B further includes patterning the epitaxial stack and underlying substrate 102 using photolithography and etching processes, thereby forming trenches and the active regions 204A and 204B protruding from between trenches, in accordance with some embodiments. The portion of substrate 102 protruding from between the trenches serves as the lower fin elements 204L of the active regions 204A and 204B, in accordance with some embodiments. The remainder of the epitaxial stack (including the first semiconductor layers 206 and the second semiconductor layers 208) serves as the upper fin elements of the active regions 204A and 204B, in accordance with some embodiments. In some embodiments, the active regions 204A and 204B are the fin structure 204 shown in FIG. 4.

In some embodiments, the thickness of each of the first semiconductor layers 206 is in a range from about 6 nm to about 16 nm. In some embodiments, the thickness of each of the second semiconductor layers 208 is in a range from about 4 nm to about 8 nm. The thickness of the second semiconductor layers 208 may be greater than, equal to, or less than the first semiconductor layers 206, depending on the amount of gate materials to be filled in spaces where the first semiconductor layers 206 are removed. Although three first semiconductor layers 206 and three second semiconductor layers 208 are shown in FIG. 5A-2, the number is not limited to three, and can be two or four, and is less than 10.

An isolation structure 106 is formed to surround the lower fin elements 204L of the active regions 204, as shown in FIG. 5A-1, in accordance with some embodiments. Dummy gate structures 108 (including $108_1$-$108_5$) are formed across the active regions 204A and 204B and the isolation structure 106, as shown in FIGS. 5A through 5A-2, in accordance with some embodiments. Gate spacer layers 114 are formed along the opposite sidewalls of the dummy gate structures $108_{1-5}$, as shown in FIGS. 5A-1 and 5A-2, in accordance with some embodiments. The formation of the isolation structure 106, the dummy gate structures 108 and the gate spacer layers 114 may be the same as or similar to the formation of the isolation structure 106, the dummy gate structures 108 and the gate spacer layers 114 described above in FIGS. 2A through 2A-2, in accordance with some embodiments.

Source/drain features 116 are formed in and/or over the source/drain regions of the active regions 204A and 204B, as shown in FIGS. 5A-1 and 5A-2, in accordance with some embodiments. After the source/drain recesses are formed, an etching process is performed to laterally recess, from the source/drain recesses, the first semiconductor layers 206 of the active regions 204A and 204B, thereby forming notches, and then inner spacer layers 210 are formed in the notches, as shown in FIG. 5A-2, in accordance with some embodiments. The inner spacer layers 210 are formed to abut the recessed side surfaces of the first semiconductor layers 206, in accordance with some embodiments. In some embodiments, the inner spacer layers 210 are located between adjacent second semiconductor layers 208 and between the lowermost second semiconductor layer 208 and the lower fin element 204L. In some embodiments, the inner spacer layers 210 extend directly below the gate spacer layers 114, in accordance with some embodiments.

The inner spacer layers 210 may avoid the source/drain features and the gate stack from being in direct contact and are configured to reduce the parasitic capacitance between the gate stack and the source/drain features (i.e., Cgs and Cgd), in accordance with some embodiments. In some embodiments, the inner spacer layers 210 are made of dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the inner spacer layers 210 are made of low-k dielectric materials. For example, the dielectric constant (k) values of the inner spacer layers 210 may be lower than a k-value of silicon oxide (SiO), such as lower than 4.2, equal to or lower than about 3.9, such as in a range from about 3.5 to about 3.9.

In some embodiments, the inner spacer layers 210 are formed by depositing a dielectric material for the inner spacer layers 210 over the semiconductor structure 200 to fill the notches, and then etching back the dielectric material to remove the dielectric material outside the notches. Portions of the dielectric material left in the notches serve as the inner spacer layers 210, in accordance with some embodiments. In some embodiments, the deposition process includes ALD, CVD (such as PECVD, LPCVD or HARP), another suitable technique, or a combination thereof. In some embodiments, the etching back process includes an anisotropic etching process such as dry plasma etching, an isotropic etching process such as dry chemical etching, remote plasma etching or wet chemical etching, or a combination thereof.

Afterward, source/drain features 116 are grown in the source/drain recesses on the exposed surfaces of the lower fin elements 204L, as shown in FIG. 5A-2, in accordance with some embodiments. A contact etching stop layer 118 is formed over the semiconductor structure 200 to cover the source/drain features 116, as shown in FIG. 5A-2, in accordance with some embodiments. A first interlayer dielectric layer 120 is formed over the contact etching stop layer 118, as shown in FIG. 5A-2, in accordance with some embodiments. The formation of the source/drain features 116, the contact etching stop layer 118 and the first interlayer dielectric layer 120 may be the same as or similar to the formation of the source/drain features 116, the contact etching stop layer 118 and the first interlayer dielectric layer 120 described above in FIGS. 2A through 2A-2, in accordance with some embodiments.

FIGS. 5B through 5B-2 illustrate a semiconductor structure 200 after the formation of final gate stacks 122, in accordance with some embodiments. FIGS. 5B-1 and 5B-2 are cross-sectional views of the semiconductor structure 200 taken along line X1-X1 and line X2-X2 of FIG. 5B, respectively.

One or more etching processes are performed to remove the dummy gate structures 108 to form gate trenches and remove the first semiconductor layers 206 of the active regions 204A and 204B to form gaps, in accordance with some embodiments. In some embodiments, the gate trenches expose the inner sidewalls of the gate spacer layers 114 facing the channel region, in accordance with some embodiments. In some embodiments, the gaps expose the inner sidewalls of the inner spacer layers 210 facing the channel region. The one or more etching processes may include an anisotropic etching process such as dry plasma etching, an isotropic etching process such as dry chemical etching, remote plasma etching or wet chemical etching, or a combination thereof.

After the one or more etching processes, the four main surfaces of the second semiconductor layers 208 are exposed, in accordance with some embodiments. The exposed second semiconductor layers 208 of each of the active regions 204 form five sets of nanostructures 208, in accordance with some embodiments. Each set includes three nanostructures 208 vertically stacked and spaced apart from one other, in accordance with some embodiments. As the term is used herein, "nanostructures" refers to the semiconductor layers with cylindrical shape, bar shaped and/or sheet shape. The nanostructures 208 function as channel layers of the resulting semiconductor devices (e.g., nanostructure transistors such as GAA transistors), in accordance with some embodiments.

The final gate stacks 122 (including $122_{1-5}$) are formed in the gate trenches and gaps, thereby wrapping around the nanostructures 208, as shown in FIGS. 5B through 5B-2, in accordance with some embodiments. Each of the final gate stacks $122_{1-5}$ includes an interfacial layer 124, a gate dielectric layer 126 and a metal gate electrode layer 128, as shown in FIGS. 5B-1 and 5B-2, in accordance with some embodiments.

The interfacial layer 124 wraps around the nanostructures 208, in accordance with some embodiments. Semiconductor material from the nanostructures 208 and the lower fin elements 204L is oxidized to form the interfacial layer 124, in accordance with some embodiments. The gate dielectric layer 126 is formed conformally along the interfacial layer 124 to wrap around the nanostructures 208, in accordance with some embodiments. The gate dielectric layer 126 is further conformally formed along the sidewalls of the inner spacer layers 210 facing the channel region, in accordance with some embodiments. The metal gate electrode layer 128 is formed to fill remainders of the gate trenches and the gaps, in accordance with some embodiments. The formation of the final gate stacks 122 may be the same as or similar to the formation of the final gate stacks 122 described above in FIGS. 2B through 2B-2, in accordance with some embodiments.

Portions of the final gate stacks 122 wrapping around the nanostructures 208 combine with the neighboring source/drain features 116 to form functional transistors (e.g., p-channel GAAFETs or n-channel GAAFETs), in accordance with some embodiments. The final gate stacks 122 engage the channel so that current can flow between the source/drain features 116 during operation.

FIGS. 5C through 5C-2 illustrate a semiconductor structure 200 after the formation of an etching stop layer 130, a second interlayer dielectric layer 132, contact plugs 136, an etching stop layer 138, a third interlayer dielectric layer, vias 156A, 156B and 158 and a first metal layer (M1), in accordance with some embodiments. FIGS. 5C-1 and 5C-2 are cross-sectional views of the semiconductor structure 200 taken along line X1-X1 and line X2-X2 of FIG. 5C, respectively.

The steps described above in FIGS. 2C through 2J-3 are performed on the semiconductor structure 200, thereby forming an etching stop layer 130, a second interlayer dielectric layer 132, contact plugs 136, an etching stop layer 138, a third interlayer dielectric layer, vias 156A, 156B and 158 and a first metal layer (M1), as shown in FIGS. 5C through 5C-2, in accordance with some embodiments.

Figure 6:
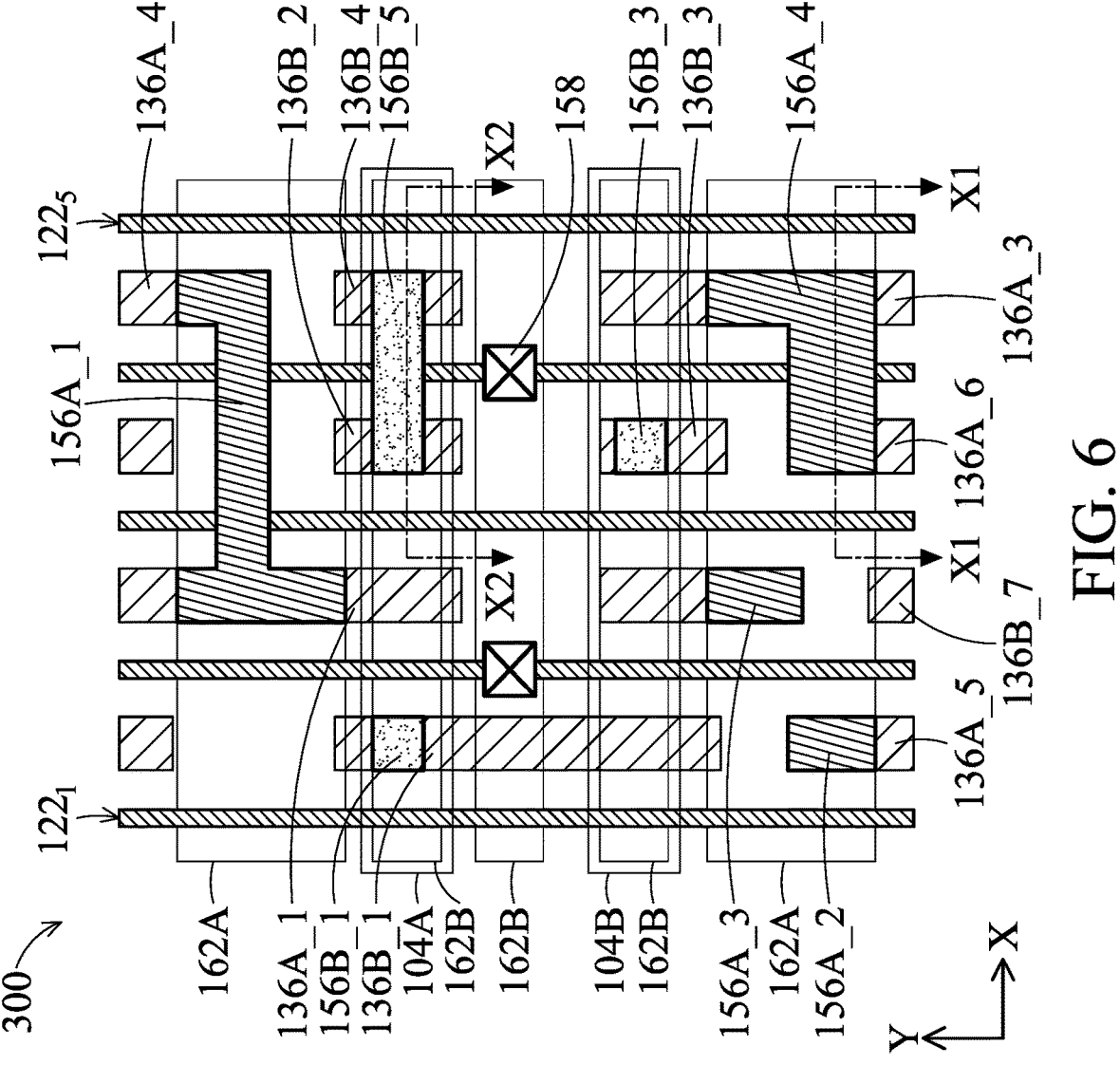
FIG. 6 is a plan view illustrating a semiconductor structure at various intermediate stages, in accordance with some embodiments of the disclosure.
Figures 2, 6:
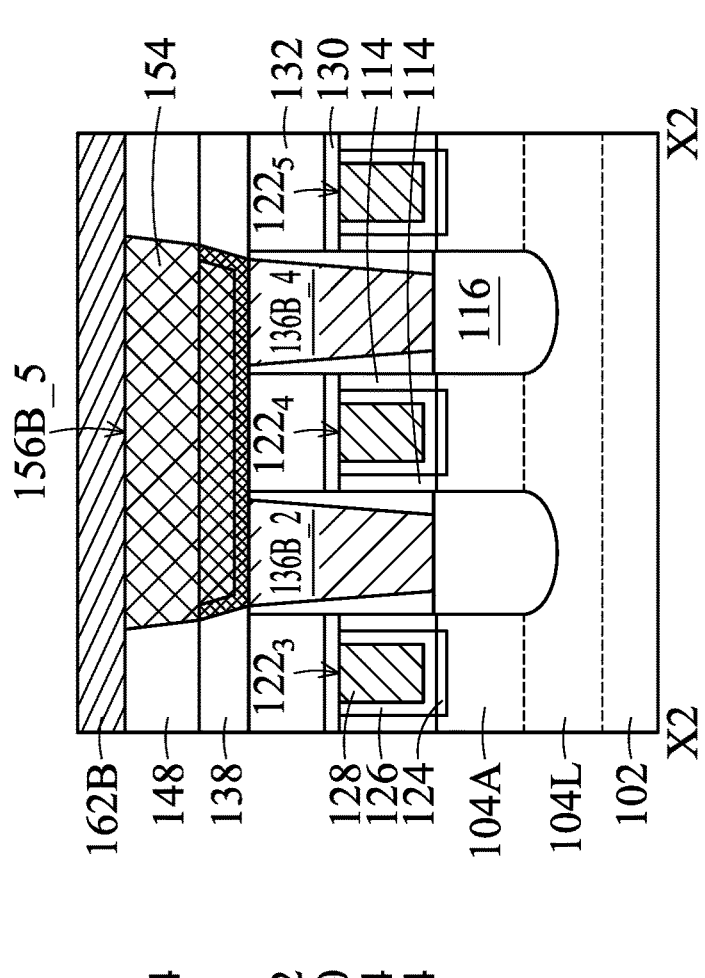
Figures 1, 6:
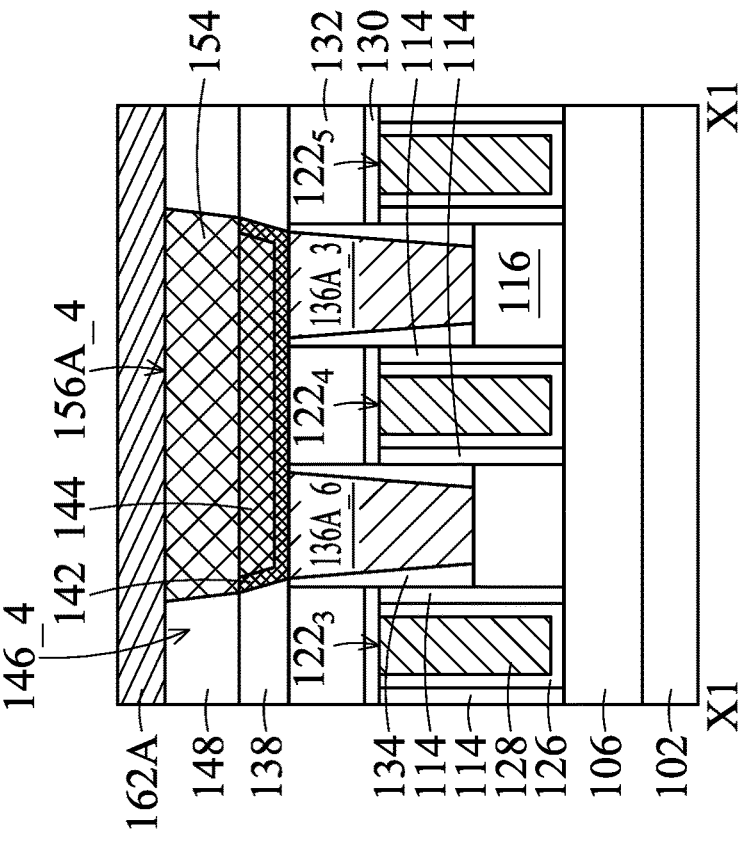

FIG. 6 is a plan view illustrating a semiconductor structure 300 at various intermediate stages, in accordance with some embodiments of the disclosure. FIGS. 6-1 and 6-2 are cross-sectional views of the semiconductor structure 300 taken along line X1-X1 and line X2-X2 of FIG. 6, respectively. The semiconductor structure 300 of FIG. 6 is similar to the semiconductor structure 100 of FIG. 2J except that the drain vias 156 includes bottom via portions and top via portions.

Each of vias 156B (including 156B_1, 156B_3 and 156B_5) includes a bottom via portion (including the barrier liner 142 and the metal bulk layer 144 nested within the barrier liner 142) and a top via portion 154, as shown in FIGS. 6 and 6-2, in accordance with some embodiments. The formation of the vias 156B is substantially the same as the formation of the via 156A, in accordance with some embodiments. For example, bottom via openings for the vias 156B are formed in the etching stop layer 138, bottom via portions are formed in the bottom via openings, top via openings for the vias 156B are formed in the third interlayer dielectric layer 148, and top via portions 154 are formed in the top via openings.

The vias 156B_5 includes a first landing portion directly above the contact plug 136B_2, a second landing portion directly above the contact plug 136B_4, and a connecting portion directly above the second interlayer dielectric layer 132 (and the contact liner 134) and connected to the first landing portion and the second landing portion, in accordance with some embodiments. The connecting portion of the via 156B_5 extends across the final gate stack $122_4$, as shown in FIG. 6, in accordance with some embodiments. As compared with vias only having landing portions (e.g., the vias 156B_2 and 156B_4), the via 156B_5 has the connecting portion, and thus may further reduce their resistance.

Figure 7B:
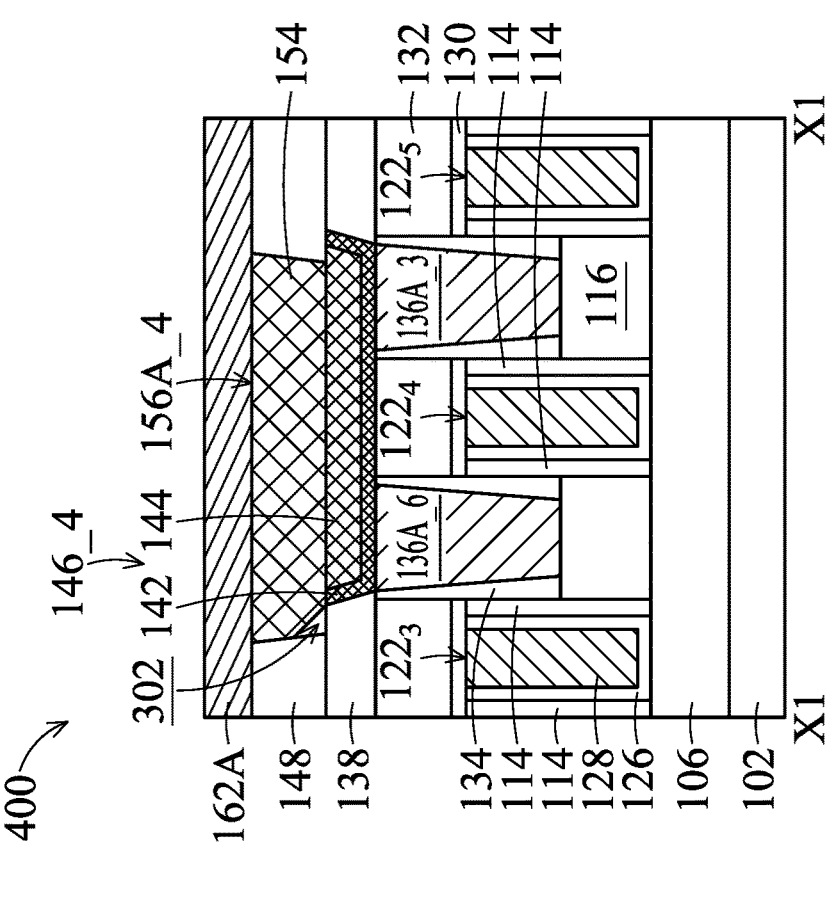
FIGS. 7A and 7B are modifications of the semiconductor structure of FIGS. 2G-1 and 2J-1, in accordance with some embodiments of the disclosure.
Figure 7A:
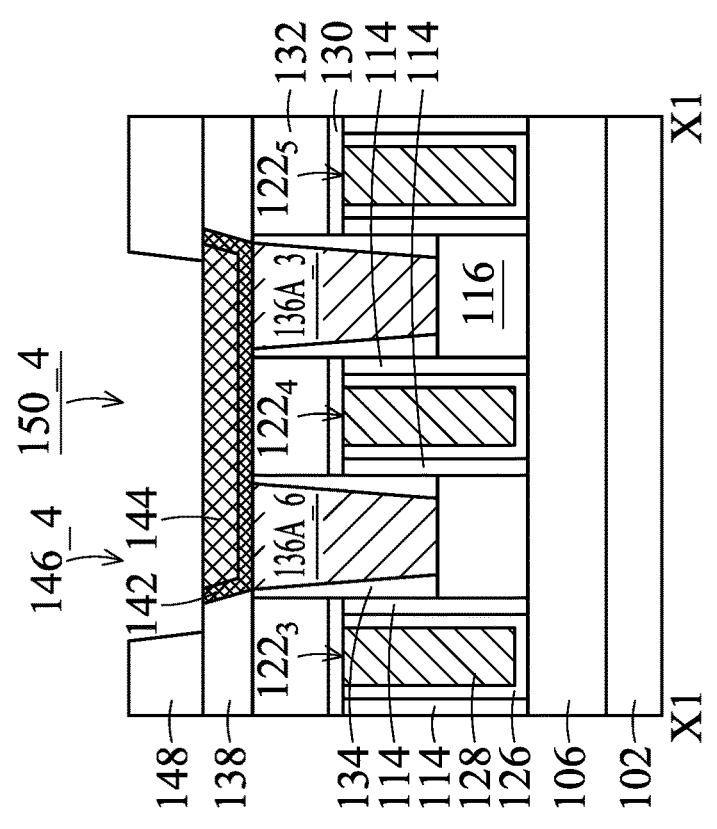

FIGS. 7A and 7B are modifications of the semiconductor structure of FIGS. 2G-1 and 2J-1, in accordance with some embodiments of the disclosure. The semiconductor structure 400 of FIGS. 7A and 7B is similar to the semiconductor structure 100 of FIGS. 2G-1 and 2J-1 except that the top via opening 150_4 is offset from the bottom via portion 146_4.

In some embodiments, due to the characteristics of the photolithography process, the top via opening 150_4 is formed offset by a distance from the bottom via portion 146_4 in the X direction, as shown in FIG. 7A, in accordance with some embodiments. In some embodiments, the etching stop layer 138 is also exposed from the top via opening 150_4.

The steps described above in FIGS. 2H through 2J-3 are performed on the semiconductor structure 400, thereby forming a third interlayer dielectric layer, vias 156A, 156B and 158 and a first metal layer (M1), as shown in FIG. 7B, in accordance with some embodiments. In some embodiments, the via 156A_4 includes the bottom via portion 146_4 and the top via portion 154 above the bottom via portion 146_4. In some embodiments, the top via portion 154 is offset by a distance from the bottom via portion 146_4 in the X direction. In some embodiments where the top via portion 154 is formed using a bottom-up deposition process, the top via portion 154 may not grow from the dielectric surfaces provided from the top surface of the etching stop layer 138, thereby forming a void 302, as shown in FIG. 7B. The void 302 is defined between the top via portion 154, the third interlayer dielectric layer 148 and the etching stop layer 138, in accordance with some embodiments.

Figure 8B:
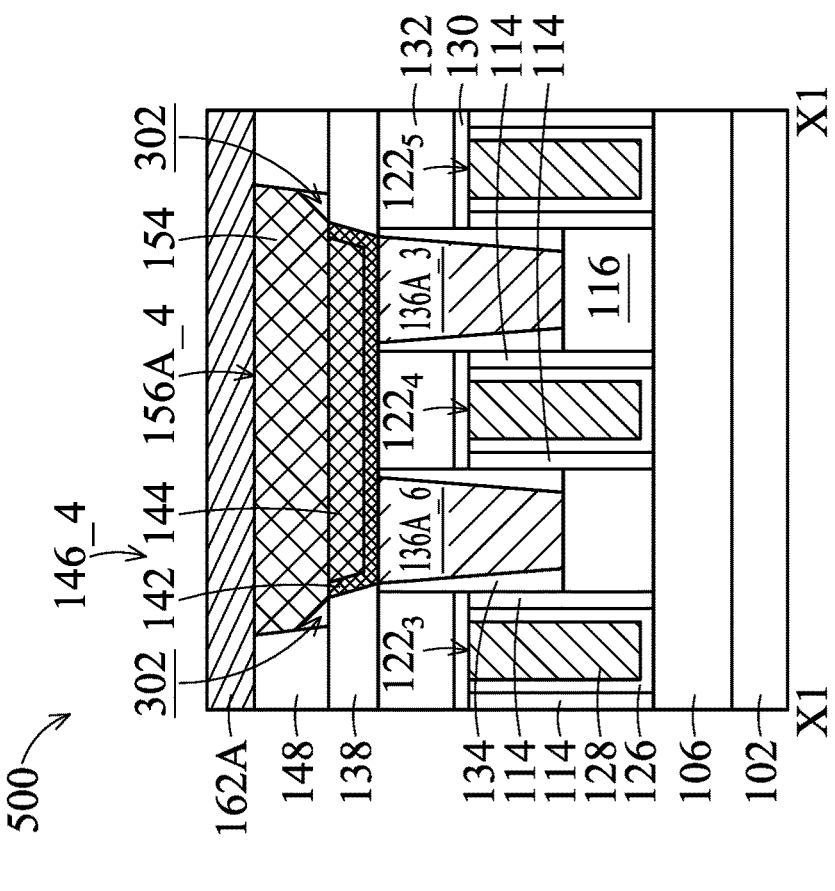
FIGS. 8A and 8B are modifications of the semiconductor structure of FIGS. 2G-1 and 2J-1, in accordance with some embodiments of the disclosure.
Figure 8A:
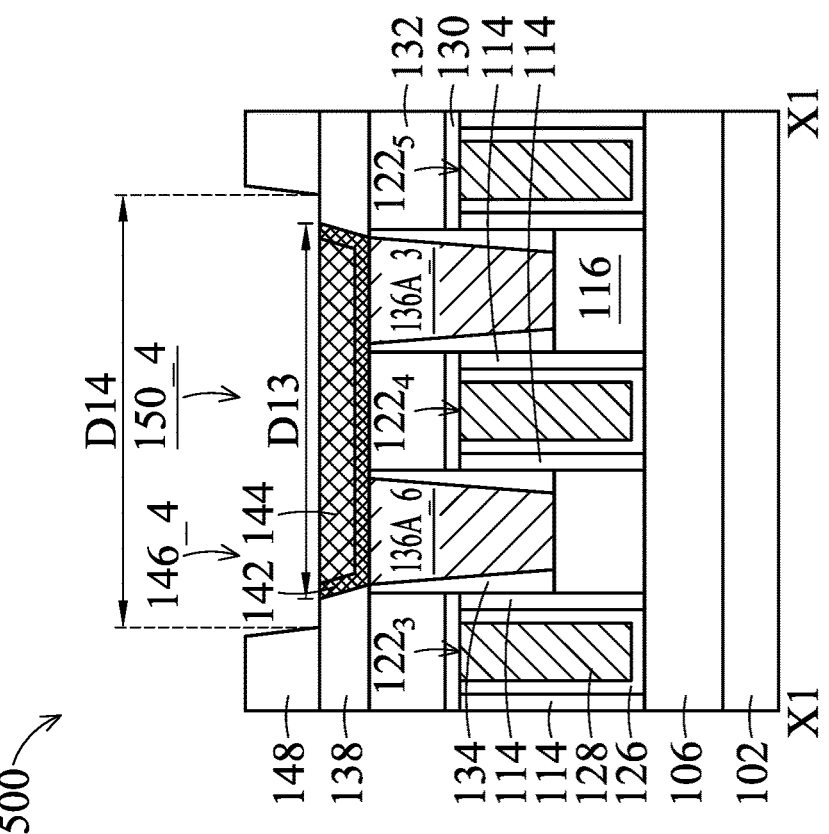

FIGS. 8A and 8B are modifications of the semiconductor structure of FIGS. 2G-1 and 2J-1, in accordance with some embodiments of the disclosure. The semiconductor structure 500 of FIGS. 8A and 8B is similar to the semiconductor structure 100 of FIGS. 2G-1 and 2J-1 except that the top via opening 150_4 is larger than the bottom via portion 146_4.

In some embodiments, due to the characteristics of the photolithography process, in the X direction, dimension D14 of the top via opening 150_4 at the bottom of the top via opening 150_4 is larger than dimension D13 of the bottom via portion 146_4 at the top of the bottom via portion 146_4, as shown in FIG. 8A, in accordance with some embodiments. In some embodiments, the etching stop layer 138 is also exposed from the top via opening 150_4.

The steps described above in FIGS. 2H through 2J-3 are performed on the semiconductor structure 500, thereby forming a third interlayer dielectric layer, vias 156A, 156B and 158 and a first metal layer (M1), as shown in FIG. 7B, in accordance with some embodiments. In some embodiments, the via 156A_4 includes the bottom via portion 146_4 and the top via portion 154 above the bottom via portion 146_4. In some embodiments, in the X direction, the dimension of the top via portion 154 at the bottom of the top via portion 154 is larger than the dimension of the bottom via portion 146_4 at the top of the bottom via portion 146_4. In some embodiments where the top via portion 154 is formed using a bottom-up deposition process, the top via portion 154 may not grow from the dielectric surfaces provided from the top surface of the etching stop layer 138, thereby forming voids 302, as shown in FIG. 7B. Each of the voids 302 is defined between the top via portion 154, the third interlayer dielectric layer 148 and the etching stop layer 138, in accordance with some embodiments.

As described above, the semiconductor structure includes a vias 156A landing on and extending over the contact plugs 136A_3 and 136A_6 and the second interlayer dielectric layer 132. The vias 156A includes a bottom via portion 146 and a top via portion 154 over the bottom via portion 146, in accordance with some embodiments. The top via portion

154 is formed using a bottom-up deposition process, and may grow from the metal surface provided by the bottom via portion 146 in the deposition process, which may facilitate the formation of void-free via 156A. Therefore, the resistance (e.g., contact resistance, Rc) of the via may reduce, and thus the performance of the semiconductor device may improve.

Embodiments of a semiconductor structure and the method for forming the same may be provided. The method for forming a semiconductor structure may include forming a bottom via opening through an etching stop layer and exposing a contact plug and a second interlayer dielectric layer, forming a bottom via portion in the bottom via opening, forming a top via opening through a third interlayer dielectric layer and exposing the bottom via portion, and forming a top via portion in the top via opening using a bottom-up deposition process. As a result, the top via opening may be free of voids. Therefore, the resistance of the via may reduce, and thus the performance of the semiconductor device may improve.

In some embodiments, a method for forming a semiconductor structure is provided. The method for forming the semiconductor structure includes forming a first contact plug and a second contact plug through a first dielectric layer. The method includes forming a second dielectric layer over the first contact plug, the second contact plug, and the first dielectric layer. The method includes etching the second dielectric layer to form a first opening exposing the first contact plug, the second contact plug and the first dielectric layer. The method includes forming a bottom via portion in the first opening. The method includes forming a third dielectric layer over the bottom via portion and the second dielectric layer. The method includes etching the third dielectric layer to form a second opening exposing the bottom via portion. The method includes forming a top via portion in the second opening. The top via portion and the bottom via portion form a first via.

In some embodiments, a method for forming a semiconductor structure is provided. The method for forming the semiconductor structure includes patterning an etching stop layer to form a bottom via opening exposing a first contact plug. The method includes forming a barrier liner on sidewalls and a bottom surface of the bottom via opening. The method includes forming a first metal bulk layer on the barrier liner to fill the remainder of the bottom via opening. The method includes forming an interlayer dielectric layer over the etching stop layer. The method includes patterning the interlayer dielectric layer to form a top via opening exposing the barrier liner and the first metal bulk layer. The method includes forming a second metal bulk layer in the top via opening. The method includes forming a metal line extending over the interlayer dielectric layer in the first direction. The metal line is in contact with the second metal bulk layer.

In some embodiments, a semiconductor structure is provided. The semiconductor structure includes a first contact plug and a second contact plug spaced apart from the first contact plug, and a first via landing on the first contact plug and the second contact plug. The first via includes a barrier liner, a first metal bulk layer nested within the barrier liner, and a second metal bulk layer over and in direct contact with the barrier liner and the first metal bulk layer. The semiconductor structure also includes a metal line on and in direct contact with the first via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
  forming a first contact plug and a second contact plug through a first dielectric layer;
  forming a second dielectric layer over the first contact plug, the second contact plug and the first dielectric layer;
  etching the second dielectric layer to form a first opening exposing the first contact plug, the second contact plug and the first dielectric layer;
  forming a bottom via portion in the first opening;
  forming a third dielectric layer over the bottom via portion and the second dielectric layer;
  etching the third dielectric layer to form a second opening exposing the bottom via portion; and
  forming a top via portion in the second opening, wherein the top via portion and the bottom via portion form a first via.

2. The method for forming the semiconductor structure as claimed in claim 1, wherein forming the bottom via portion in the first opening comprises:
  depositing a barrier liner along an upper surface of the second dielectric layer and sidewalls and a bottom surface of the first opening;
  depositing a first metal bulk layer over the barrier liner to fill the first opening; and
  planarizing portions of the barrier liner and the first metal bulk layer over the upper surface of the second dielectric layer, wherein remaining portions of the barrier liner and the first metal bulk layer in the first opening form the bottom via portion.

3. The method for forming the semiconductor structure as claimed in claim 2, wherein forming the top via portion in the second opening comprises:
  depositing a second metal bulk layer from the bottom via portion until the second metal bulk layer protrudes from the second opening; and
  planarizing portions of the second metal bulk layer over an upper surface of the third dielectric layer, wherein a portion of the second metal bulk layer remaining in the second opening forms the top via portion.

4. The method for forming the semiconductor structure as claimed in claim 3, wherein a seam is formed within the first metal bulk layer and terminates at an interface between the first metal bulk layer and the second metal bulk layer.

5. The method for forming the semiconductor structure as claimed in claim 1, further comprising:
  forming a first active region over a substrate;
  forming a first source/drain feature and a second source/drain feature on the first active region, wherein the first contact plug and the second contact plug land on the first source/drain feature and the second source/drain feature, respectively; and
  forming a gate stack across the first active region and between the first contact plug and the second contact plug.

6. The method for forming the semiconductor structure as claimed in claim 1, further comprising:
  forming a third contact plug through the first dielectric layer;
  after forming the second opening, etching the third dielectric layer and the second dielectric layer to form a third opening exposing the third contact plug; and
  forming a second via in the third opening.

7. The method for forming the semiconductor structure as claimed in claim 1, further comprising:
  forming a metal line on and in contact with the first via.

8. The method for forming the semiconductor structure as claimed in claim 7, wherein a first portion of the first opening directly above the second contact plug has a first dimension in a direction that is parallel to a longitudinal axis of the second contact plug, a second portion of the first opening directly above the first dielectric layer has a second dimension in the direction, and the second dimension is less than the first dimension.

9. The method for forming the semiconductor structure as claimed in claim 1, wherein the second opening further exposes the second dielectric layer.

10. A method for forming a semiconductor structure, comprising:
  patterning an etching stop layer to form a bottom via opening exposing a first contact plug;
  forming a barrier liner on sidewalls and a bottom surface of the bottom via opening;
  forming a first metal bulk layer on the barrier liner to fill a remainder of the bottom via opening;
  forming an interlayer dielectric layer over the etching stop layer;
  patterning the interlayer dielectric layer to form a top via opening exposing the barrier liner and the first metal bulk layer;
  forming a second metal bulk layer in the top via opening; and
  forming a metal line extending over the interlayer dielectric layer in a first direction and in contact with the second metal bulk layer.

11. The method for forming the semiconductor structure as claimed in claim 10, wherein a same reticle is used for patterning the etching stop layer and patterning the interlayer dielectric layer.

12. The method for forming the semiconductor structure as claimed in claim 11, wherein the bottom via opening is larger than the first contact plug in the first direction.

13. The method for forming the semiconductor structure as claimed in claim 11, wherein the bottom via opening has a first angle between one of the sidewalls and the bottom surface of the bottom via opening, the top via opening has a second angle between a sidewall and a bottom surface of the top via opening, and the second angle is different than the first angle.

14. The method for forming the semiconductor structure as claimed in claim 10, further comprising:
  forming an active region over a substrate, wherein the first contact plug is formed on a source/drain region of the active region; and
  forming a first gate stack and a second gate stack across the active region, wherein the bottom via opening extends across the first gate stack and the second gate stack in the first direction.

15. The method for forming the semiconductor structure as claimed in claim 14, wherein the active region includes a lower fin element extending in the first direction and a plurality of nanostructures stacked over the lower fin element and wrapped by the first gate stack.

16. A semiconductor structure, comprising:

a first contact plug and a second contact plug spaced apart from the first contact plug;

a first via landing on the first contact plug and the second contact plug, wherein the first via includes a barrier liner, a first metal bulk layer nested within the barrier liner, and a second metal bulk layer over and in direct contact with the barrier liner and the first metal bulk layer;

a metal line on and in direct contact with the first via;

a first dielectric layer surrounding the barrier liner and the first metal bulk layer; and a second dielectric layer over the first dielectric layer and surrounding the second metal bulk layer, wherein the first dielectric layer and the second dielectric layer are made of different materials.

17. The semiconductor structure as claimed in claim 16, further comprising:

a third contact plug spaced apart from the first contact plug; and a second via landing on the first contact plug and the second contact plug, wherein the second via is made of the second metal bulk layer, wherein the second metal bulk layer of the second via is thicker than the second metal bulk layer of the first via.

18. The semiconductor structure as claimed in claim 16, wherein the metal line extends in a first horizontal direction, the first contact plug and the second contact plug extend in a second horizontal direction that is perpendicular to the first horizontal direction, and in the second horizontal direction, a first portion of the first via directly above the first contact plug is larger than a second portion of the first via directly above the second contact plug.

19. The semiconductor structure as claimed in claim 16, wherein the barrier liner has grains with a first average grain size, the first metal bulk layer has grains with a second average grain size that is greater than the first average grain size, and the second metal bulk layer has grains with a third average grain size that is greater than the second average grain size.

20. The semiconductor structure as claimed in claim 16, wherein the first metal bulk layer is spaced apart from the first dielectric layer by the barrier liner.

* * * * *